United States Patent
Oyama et al.

(10) Patent No.: US 11,076,518 B2
(45) Date of Patent: Jul. 27, 2021

(54) COMPONENT SUPPLY DEVICE

(71) Applicant: YAMAHA HATSUDOKI KABUSHIKI KAISHA, Iwata (JP)

(72) Inventors: Kazuyoshi Oyama, Shizuoka (JP); Ryouta Masuda, Shizuoka (JP); Koji Yamazumi, Shizuoka (JP); Haruyasu Fujita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 277 days.

(21) Appl. No.: 16/321,785

(22) PCT Filed: Aug. 8, 2016

(86) PCT No.: PCT/JP2016/073310
§ 371 (c)(1),
(2) Date: Jan. 29, 2019

(87) PCT Pub. No.: WO2018/029753
PCT Pub. Date: Feb. 15, 2018

(65) Prior Publication Data
US 2020/0015395 A1    Jan. 9, 2020

(51) Int. Cl.
*H05K 13/04*    (2006.01)
*H01L 21/67*    (2006.01)

(52) U.S. Cl.
CPC ......... *H05K 13/0419* (2018.08); *H01L 21/67* (2013.01)

(58) Field of Classification Search
CPC ..... H05K 13/02; H05K 13/0419; H01L 21/67
See application file for complete search history.

(56) References Cited

U.S. PATENT DOCUMENTS

| | | | |
|---|---|---|---|
| 8,635,766 B2* | 1/2014 | Hanamura | H05K 13/021 29/740 |
| 9,674,995 B2* | 6/2017 | Yanagida | H05K 13/02 |
| 10,271,469 B2* | 4/2019 | Tanokuchi | H05K 13/021 |

(Continued)

FOREIGN PATENT DOCUMENTS

| | | |
|---|---|---|
| CN | 103053021 A | 4/2013 |
| JP | H04-022196 A | 1/1992 |

(Continued)

OTHER PUBLICATIONS

International Search Report issued in PCT/JP2016/073310; dated Oct. 25, 2016.

*Primary Examiner* — Minh N Trinh
(74) *Attorney, Agent, or Firm* — Studebaker & Brackett PC

(57) ABSTRACT

A component supply device supplies components stored in a component storage tape to a component extracting position. The component supply device includes a component exposing unit that exposes the components in the component storage tape fed by a tape feeding unit, the component storage tape traveling on a travel path formed from a tape travel path forming unit. The component exposing unit includes an insertion member that is inserted between a cover tape and a carrier tape and includes a base part and a tip part continuous with an upstream end in a tape feeding direction of the base part. The tip part is inclined toward the cover tape away from the carrier tape with respect to the base part in a state where the insertion member is inserted between the cover tape and the carrier tape.

5 Claims, 23 Drawing Sheets

(56) References Cited

U.S. PATENT DOCUMENTS

| | | | |
|---|---|---|---|
| 10,683,184 B2* | 6/2020 | Oyama | H05K 13/0215 |
| 2010/0186901 A1 | 7/2010 | Ikeda et al. | |
| 2013/0155639 A1 | 6/2013 | Ogawa et al. | |
| 2020/0015395 A1* | 1/2020 | Oyama | H05K 13/02 |

FOREIGN PATENT DOCUMENTS

| | | |
|---|---|---|
| JP | 2010-199567 A | 9/2010 |
| JP | 2011-029260 A | 2/2011 |
| WO | 2014/033801 A1 | 3/2014 |

* cited by examiner

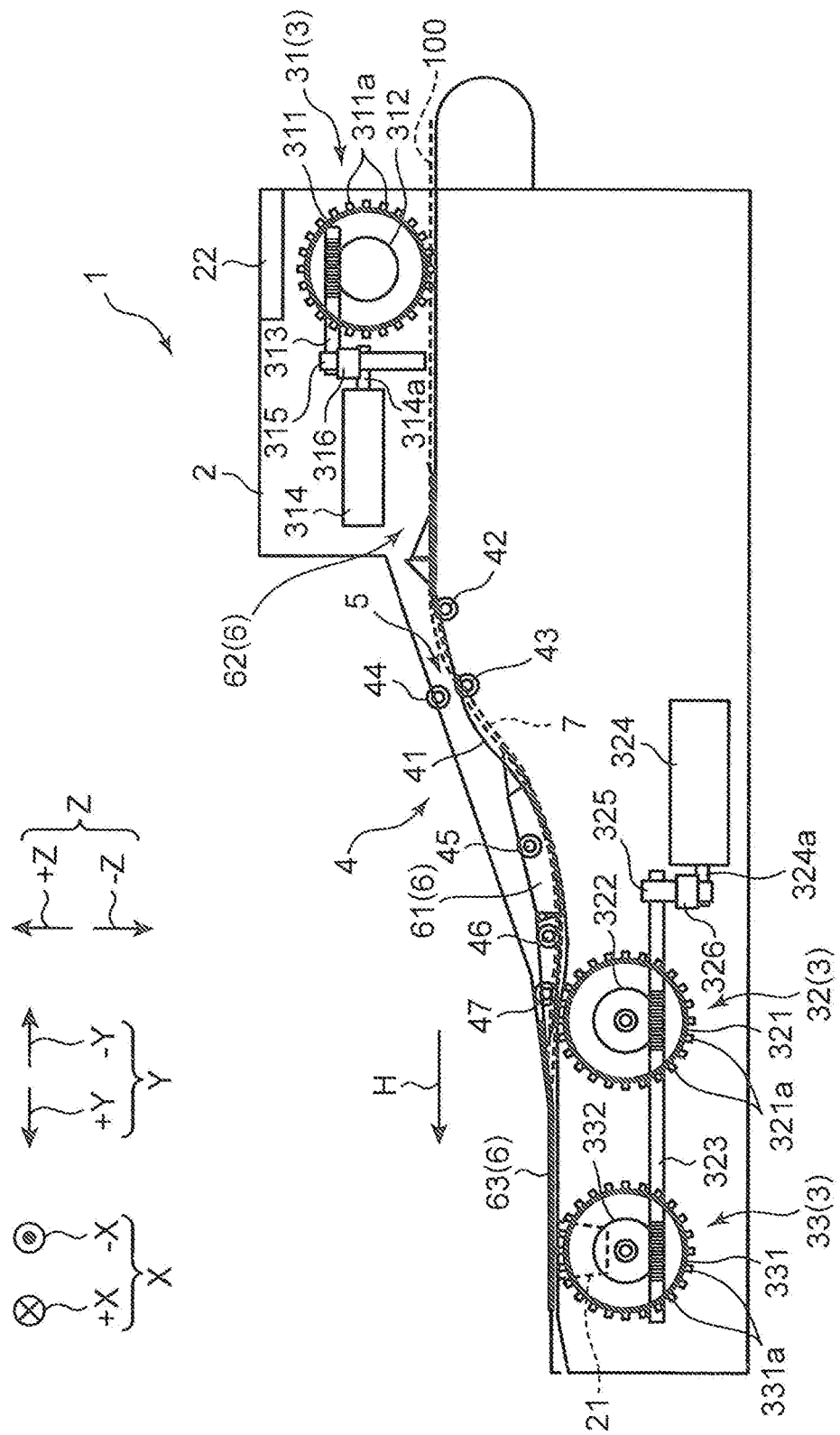

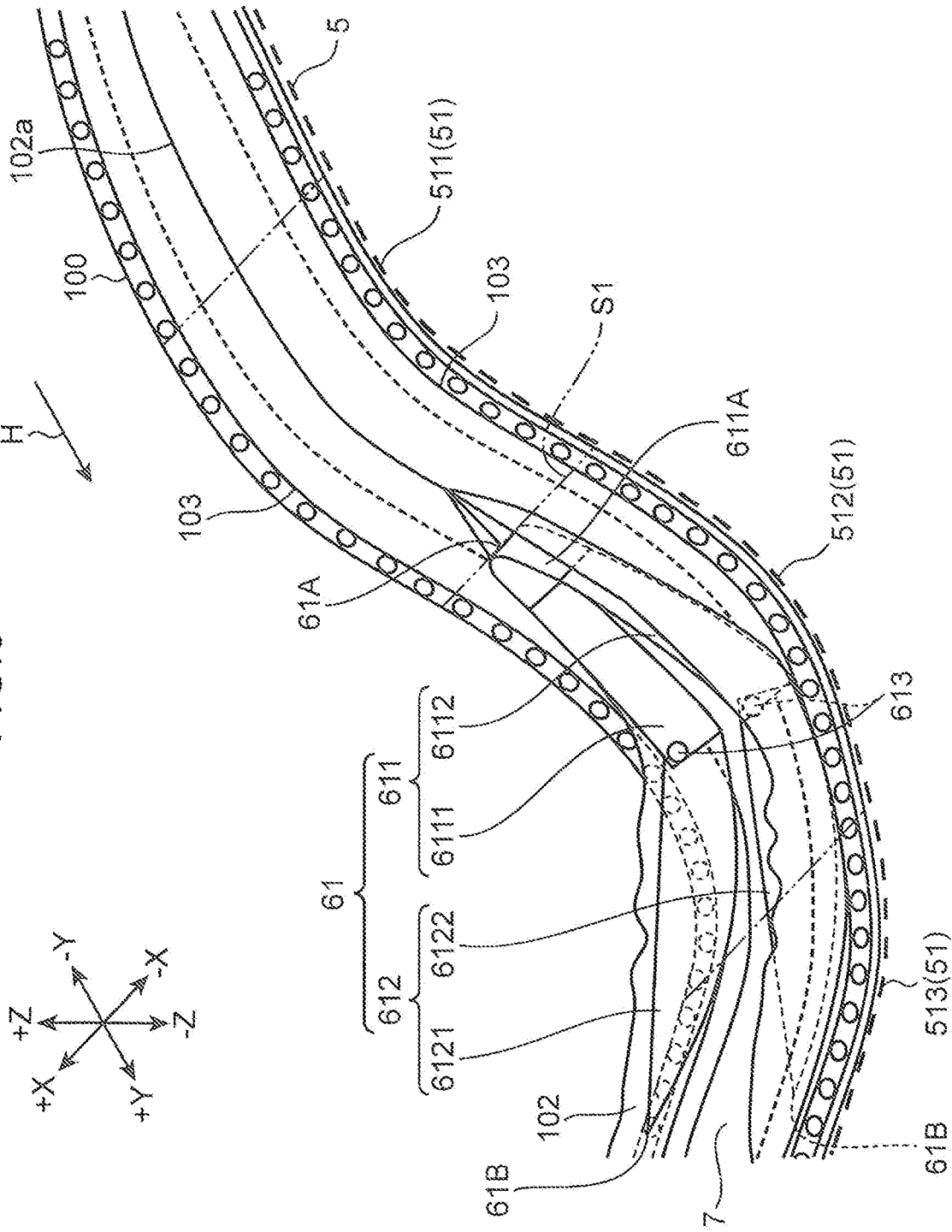

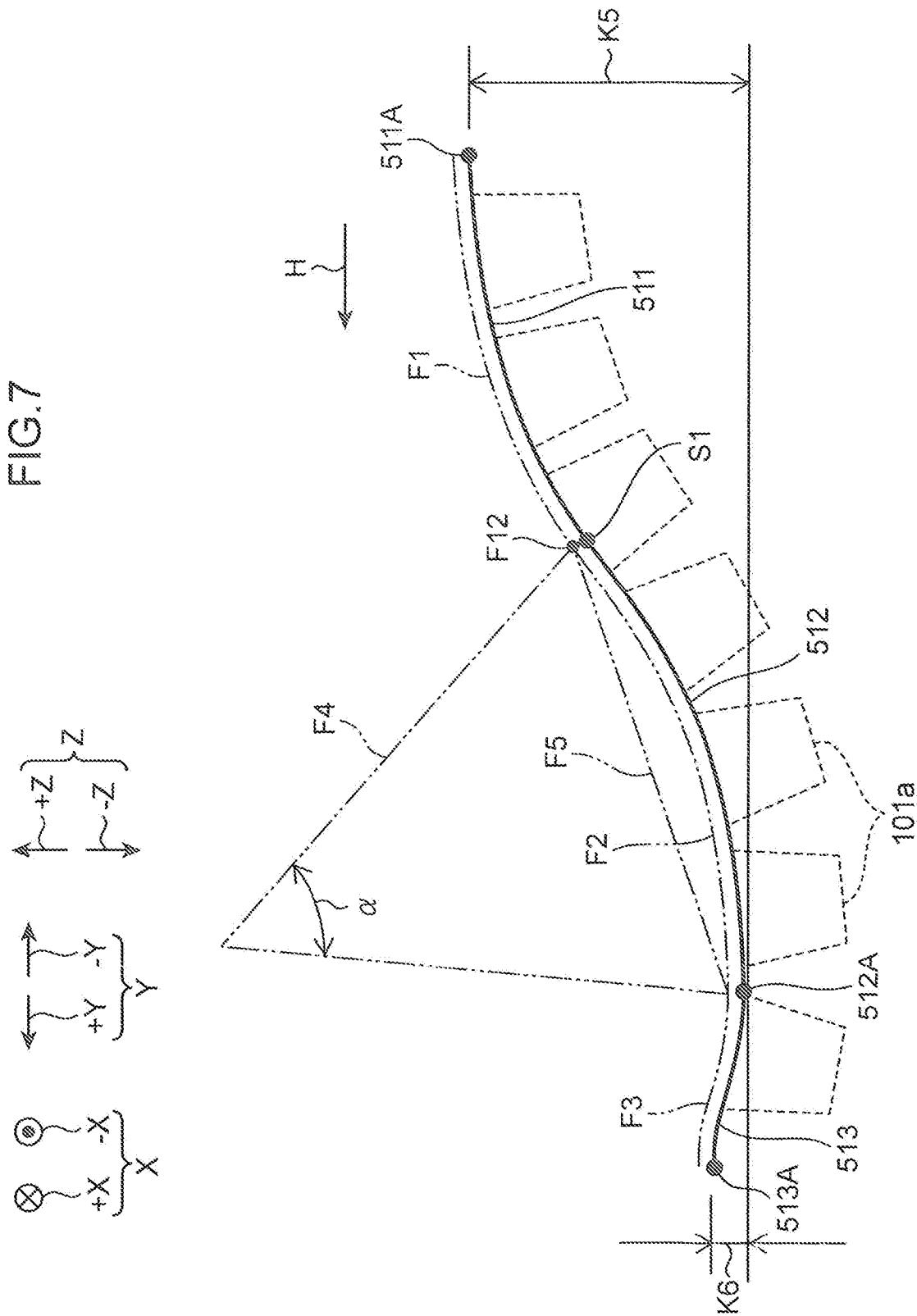

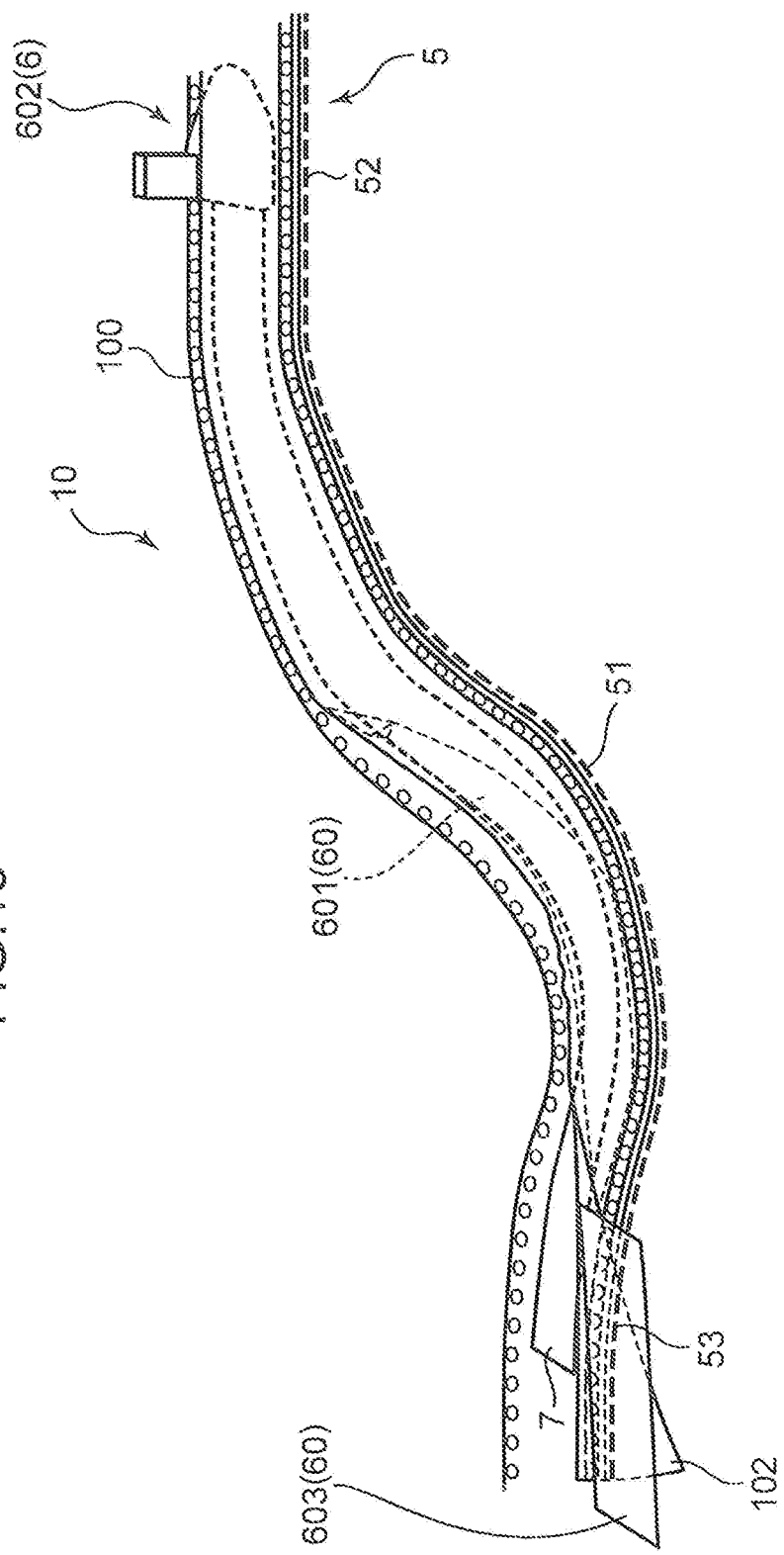

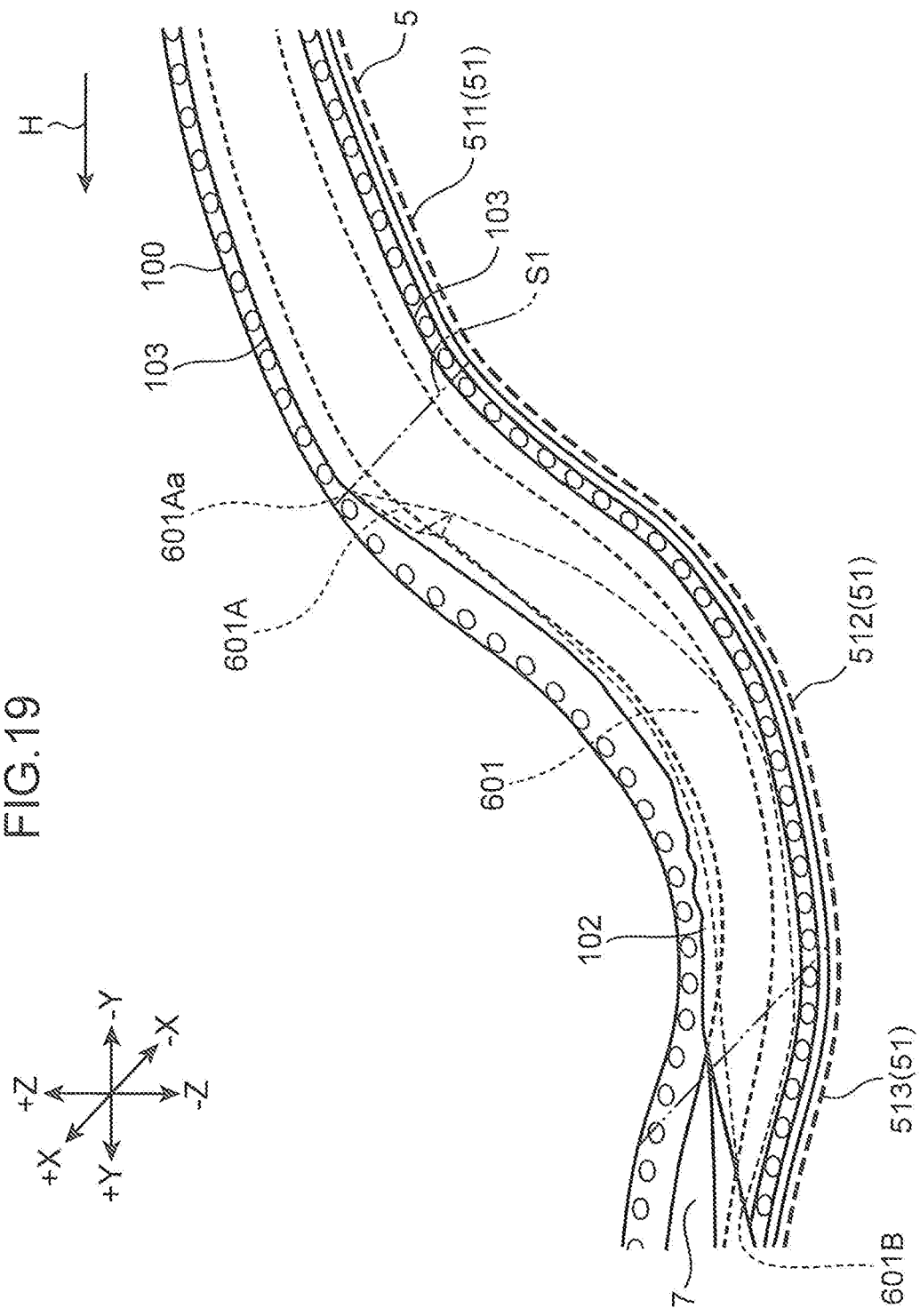

COMPONENT SUPPLY DEVICE

CROSS-REFERENCE TO RELATED APPLICATION

This application is a National Stage of International Patent Application No. PCT/JP2016/073310, filed Aug. 8, 2016, the entire content of which is incorporated herein by reference.

BACKGROUND

Technical Field

The present disclosure relates to a component supply device that supplies components stored in a component storage tape to a component extracting position.

Background Art

A component mounting machine for mounting electronic components (hereinbelow, merely referred to as the "components") on a substrate such as a printed wiring board is provided with a component supply device that supplies the components to a component extracting position. A device using a component storage tape in which components are stored is known as the component supply device. The component storage tape includes a carrier tape which includes component storage parts for storing the components and a cover tape which is stuck to the carrier tape to cover the component storage parts. This kind of component supply device is disclosed, for example, in JP 2010-199567 A.

The component supply device disclosed in JP 2010-199567 A is provided with a tape feeding device which intermittently feeds a component storage tape and a component exposing device which exposes each component inside a component storage part of the component storage tape which is intermittently fed by the tape feeding device. In the component supply device, the component exposing device includes a tongue portion which is inserted between a cover tape and a carrier tape in the component storage tape, a cover tape cutting device which cuts the cover tape, and a cover tape opening device which opens the cut cover tape.

In the component supply device disclosed in JP 2010-199567 A described above, the cover tape is spread out and opened in the right-left direction by the cover tape opening device while being cut by the cover tape cutting device with the tongue portion inserted between the cover tape and the carrier tape. Accordingly, a component is removably exposed inside the component storage part of the component storage tape.

SUMMARY

In a carrier tape of a component storage tape, a plurality of component storage parts are arrayed at predetermined intervals.

In the above conventional component supply device, when the component storage tape is intermittently fed by the tape feeding device with the tongue portion inserted between the cover tape and the carrier tape, the tip of the tongue portion may make contact with a region part located between adjacent component storage parts (hereinbelow, referred to as the "storage part connecting region part") in the carrier tape. If the tip of the tongue portion makes contact with the storage part connecting region part in the carrier tape when the component storage tape is intermittently fed by the tape feeding device, the traveling performance of the component storage tape is deteriorated, which reduces the efficiency of supplying the components to the component extracting position by the component supply device.

The present disclosure has been made in view of the above circumstances, and provides a component supply device that supplies components stored in a component storage tape to a component extracting position, the component supply device being capable of efficiently supplying the components.

A component supply device according to one aspect of the present disclosure supplies components to a component extracting position using a component storage tape, the component storage tape including a carrier tape including a plurality of component storage parts arrayed at predetermined intervals for storing the components and a cover tape stuck to the carrier tape to cover the component storage parts. The component supply device includes a tape feeding unit that feeds the component storage tape toward the component extracting position in a tape feeding direction along an array direction of the component storage parts, a tape travel path forming unit that forms a travel path leading to the component extracting position for the component storage tape fed by the tape feeding unit, and a component exposing unit that is disposed on the travel path and exposes the components inside the component storage parts of the component storage tape traveling on the travel path. The component exposing unit includes an insertion member inserted between the cover tape and the carrier tape in the component storage tape traveling on the travel path, the insertion member including a base part and a tip part continuous with an upstream end in the tape feeding direction of the base part. The tip part is inclined toward the cover tape away from the carrier tape with respect to the base part in a state where the insertion member is inserted between the cover tape and the carrier tape.

The objects, features, and advantages of the present disclosure will become more apparent from the following detailed description and the accompanying drawings.

BRIEF DESCRIPTION OF THE DRAWINGS

FIG. 1 is a diagram schematically illustrating the configuration of a component supply device according to a first embodiment of the present disclosure;

FIG. 6 is a diagram illustrating the configuration of a cover tape raising unit in the component exposing unit;

FIG. 7 is a diagram for describing the shape of a first path part in a travel path formed from the tape travel path forming unit;

FIG. 18 is a diagram schematically illustrating the configuration of a component exposing unit included in a component supply device according to a second embodiment of the present disclosure;

FIG. 19 is a diagram illustrating the configuration of a cover tape raising unit in the component exposing unit according to the second embodiment;

DETAILED DESCRIPTION

Hereinbelow, a component supply device according to embodiments of the present disclosure will be described with reference to the drawings. In the following description, the directional relationship will be described using XYZ rectangular coordinate axes. A right-left direction is defined as an X-axis direction, a front-rear direction perpendicular to the X-axis direction is defined as a Y-axis direction, and an upper-lower direction perpendicular to both the X-axis direction and the Y-axis direction is defined as a Z-axis direction. Further, a left direction which is one direction in the X-axis direction is referred to as a "+X direction", and a right direction which is the other direction opposite to the one direction in the X-axis direction is referred to as a "−X direction". Further, a front direction which is one direction in the Y-axis direction is referred to as a "+Y direction", and a rear direction which is the other direction opposite to the one direction in the Y-axis direction is referred to as a "−Y direction". Further, a lower direction which is one direction in the Z-axis direction is referred to as a "−Z direction", and an upper direction which is the other direction opposite to the one direction in the Z-axis direction is referred to as a "+Z direction".

First Embodiment

Figure 2A:
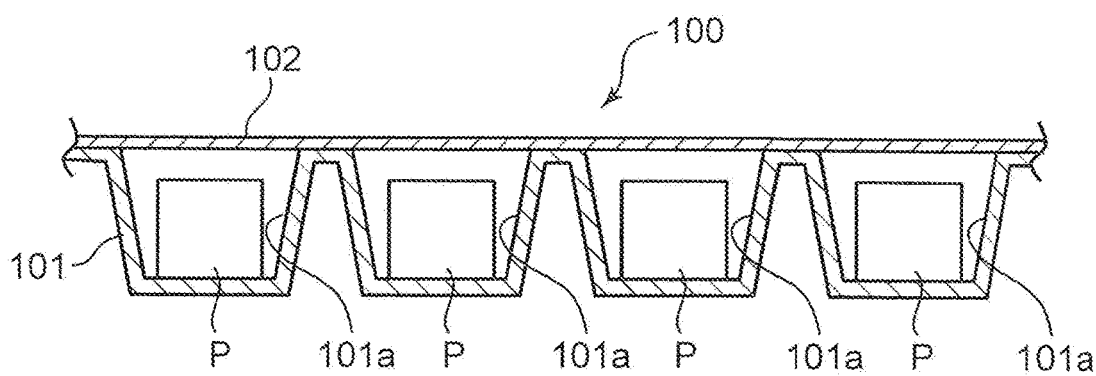
FIGS. 2A and 2B are diagrams illustrating the configuration of a component storage tape used in the component supply device.
Figure 2B:
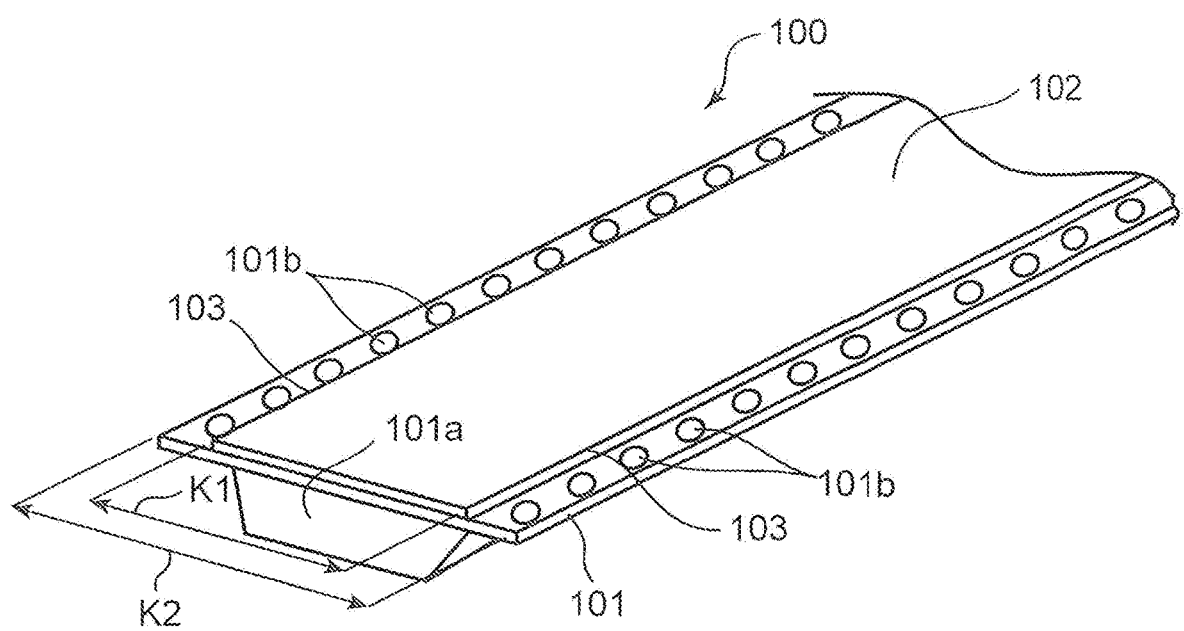

FIG. 1 is a diagram schematically illustrating the configuration of a component supply device 1 according to a first embodiment of the present disclosure. The component supply device 1 is attached to a component mounting machine for mounting components on a substrate such as a printed wiring board and used for supplying components stored in a component storage tape to a component extracting position 21. The component supplied to the component extracting position 21 by the component supply device 1 is extracted from the component storage tape by a suction nozzle included in the component mounting machine and then mounted on the substrate. The suction nozzle is capable of sucking and holding a component (extracting the component) by the supply of a negative pressure to the suction nozzle. The sucking and holding of the component is released by the supply of a positive pressure to the suction nozzle. A mechanism for removing a component from the component storage tape may be a head unit which is provided with a plurality of mounting heads each of which includes a suction nozzle attached to the tip thereof. Prior to describing the configuration of the component supply device 1, the component storage tape will be described with reference to FIGS. 2A and 2B. FIGS. 2A and 2B are diagrams illustrating the configuration of a component storage tape 100 which is used in the component supply device 1.

The component storage tape 100 includes a carrier tape 101 and a cover tape 102. The carrier tape 101 includes a plurality of component storage parts 101a which are arrayed at predetermined intervals for storing components P. Further, the carrier tape 101 includes engagement holes 101b which are arrayed at predetermined intervals on both ends in the width direction of the carrier tape 101. The engagement holes 101b are engaged with teeth of a first sprocket 311, a second sprocket 321, and a third sprocket 331 in a tape feeding unit 3 (described below) to feed the component storage tape 100 by the tape feeding unit 3. Note that "the engagement holes 101b of the component storage tape 100 are engaged with the teeth of the first sprocket 311, the second sprocket 321, and the third sprocket 331" indicates a state in which the teeth are fit in the engagement holes 101b to enable feeding of the component storage tape 100 in conjunction with the rotations of the first sprocket 311, the second sprocket 321, and the third sprocket 331.

The cover tape 102 is stuck to the carrier tape 101 to cover the component storage parts 101a. Both ends in the width direction of the cover tape 102 are melted to stick the cover tape 102 to the carrier tape 101. Thus, in the component storage tape 100, fused parts 103 formed by the melting of the cover tape 102 are linearly formed on both ends in the width direction of the upper face of the carrier tape 101 along the inner side of edges in the width direction of the cover tape 102. In the width direction of the carrier tape 101, the fused parts 103 are disposed on the inner side with respect to the engagement holes 101b.

In the component storage tape 100 having the configuration as described above, a length K1 between the fused parts 103, which are formed on both the ends in the width direction of the carrier tape 101 along the inner side of edges in the width direction of the cover tape 102, is substantially equal to the length in the width direction of the cover tape 102. Further, a length K2 in the width direction of the component storage tape 100 is equal to the length in the width direction of the carrier tape 101.

As illustrated in FIG. 1, the component supply device 1 is provided with a device body 2, the tape feeding unit 3, a tape travel path forming unit 4, a component exposing unit 6, and a cover member 7. The device body 2 is a housing which accommodates each unit of the component supply device 1. An operation panel 22 is attached to the device body 2. The operation panel 22 is a part to which an instruction for operating the component supply device 1 is input by an operator.

Figure 3:
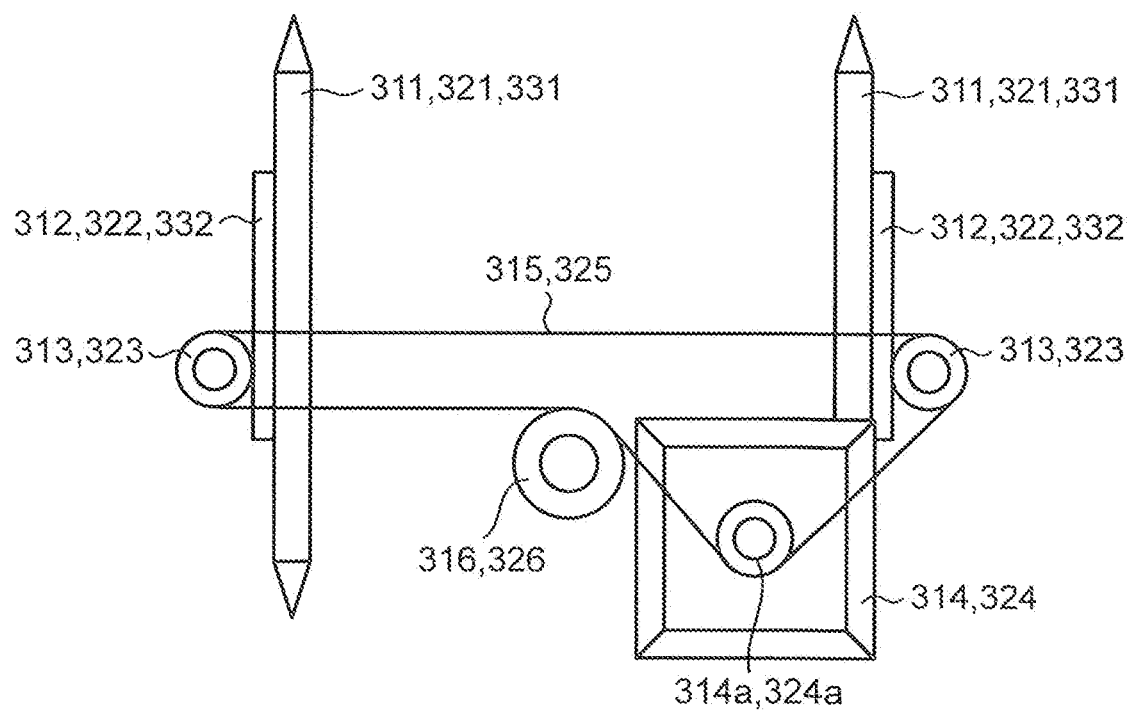
FIG. 3 is a diagram illustrating a tape feeding unit included in the component supply device viewed in a tape feeding direction.
Figure 4:
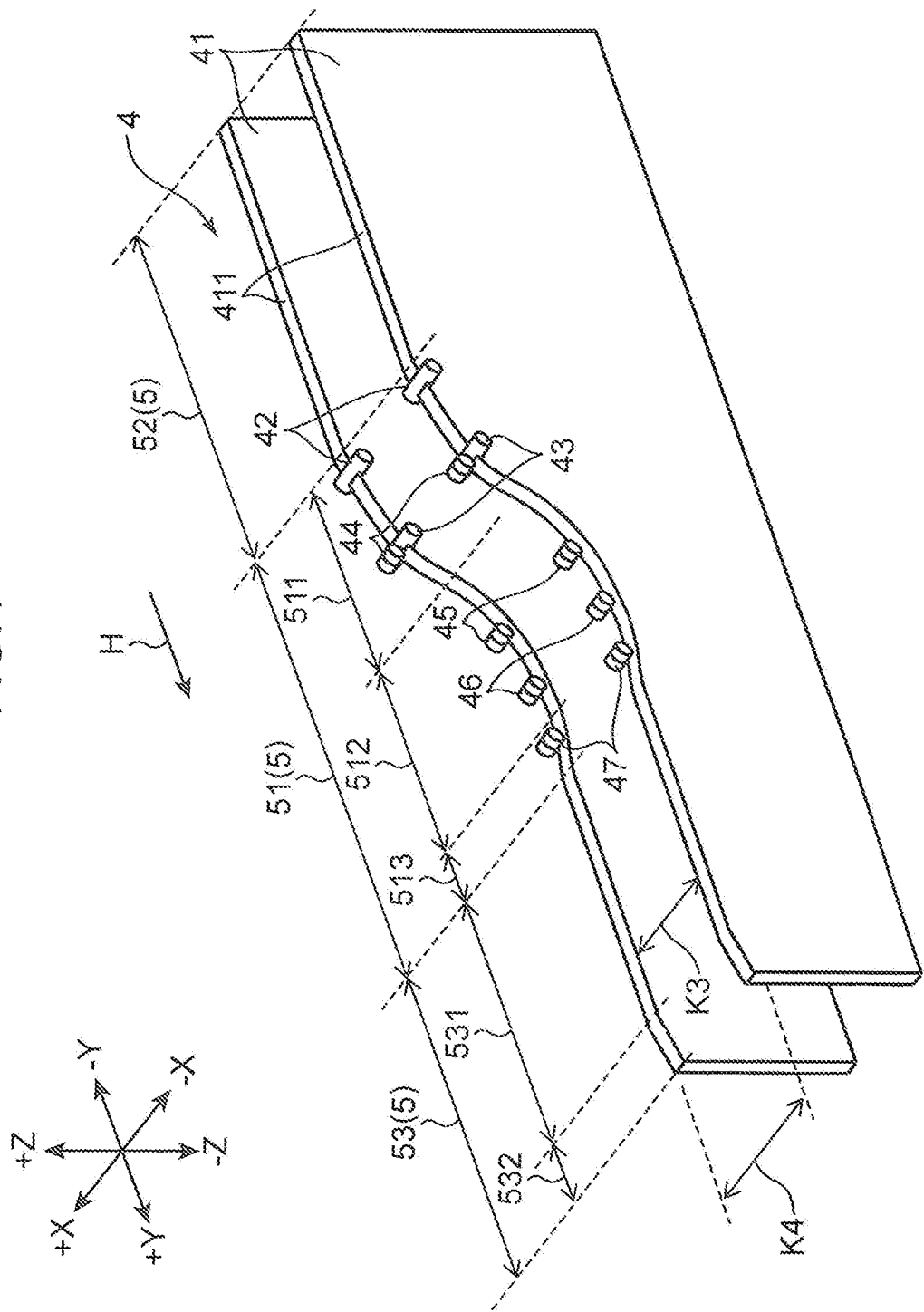
FIG. 4 is a diagram illustrating the configuration of a tape travel path forming unit included in the component supply device.
Figure 5:
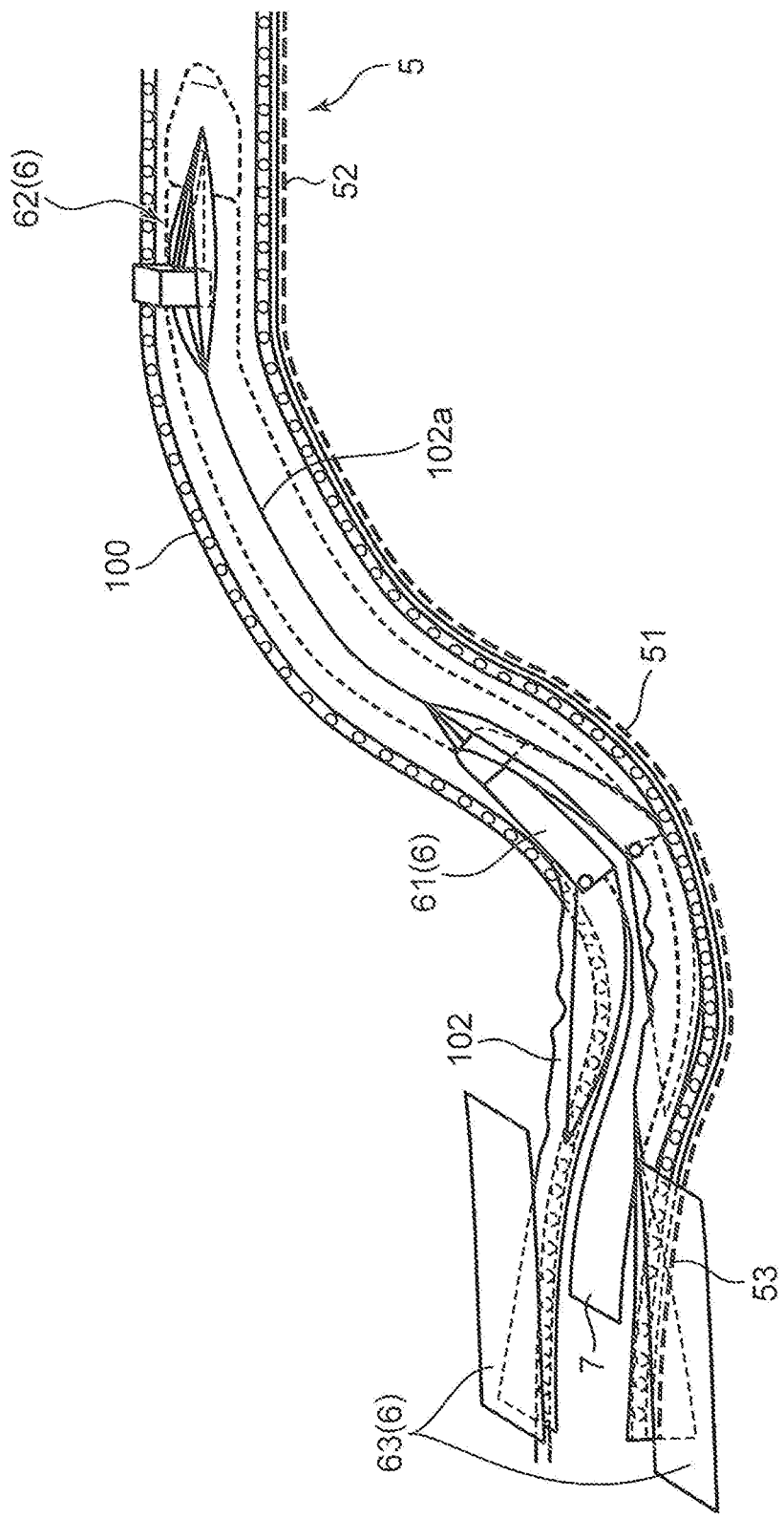
FIG. 5 is a diagram illustrating the configuration of a component exposing unit included in the component supply device.

FIG. 3 is a diagram schematically illustrating the configuration of the tape feeding unit 3 included in the component supply device 1 viewed in a tape feeding direction H. FIG. 4 is a diagram illustrating the configuration of the tape travel path forming unit 4 included in the component supply device 1. FIG. 5 is a diagram illustrating the configuration of the component exposing unit 6 included in the component supply device 1.

The tape feeding unit 3 feeds the component storage tape 100 toward the component extracting position 21 in the predetermined tape feeding direction H along the array direction of the component storage parts 101a. The tape feeding direction H when the tape feeding unit 3 feeds the component storage tape 100 toward the component extracting position 21 corresponds to the +Y direction. The tape feeding unit 3 intermittently feeds the component storage tape 100 in the tape feeding direction H so that the component storage parts 101a arrive at the component extracting position 21 one by one at predetermined time intervals. The tape feeding unit 3 is capable of executing a loading operation for feeding the component storage tape 100 toward the component extracting position 21 in the tape feeding direction H and an unloading operation for feeding the component storage tape 100 in the −Y direction which is opposite to the tape feeding direction H.

The tape travel path forming unit 4 forms a travel path 5 leading to the component extracting position 21 for the component storage tape 100 which is fed by the tape feeding unit 3. As illustrated in FIGS. 1 and 4, the tape travel path forming unit 4 includes a pair of guide walls 41 and a plurality guide rollers including first to sixth guide rollers 42, 43, 44, 45, 46, 47.

The pair of guide walls 41 is a pair of wall parts which is opposed to each other with a predetermined interval therebetween in the X-axis direction and extends in the Y-axis direction inside the device body 2. Both ends in the X-axis direction of a face on the −Z direction side (the lower face) of the component storage tape 100, which is fed by the tape feeding unit 3, are guided by end faces 411 (hereinbelow, referred to as the "guide faces 411") on the +Z direction side of the pair of guide walls 41. That is, the travel path 5 is formed along the guide faces 411 of the pair of guide walls 41. The pair of guide walls 41 is cut away in region parts in which a pair of the second sprockets 321 of a second feeding unit 32 and a pair of the third sprockets 331 of a third feeding unit 33 (described below) are disposed in the tape feeding unit 3.

A distance K3 between opposed inner faces of the pair of guide walls 41 is set to be substantially equal to the length K1 between the fused parts 103 of the component storage tape 100. Further, a distance K4 between outer faces of the pair of guide walls 41 is set to be substantially equal to the length K2 in the width direction of the component storage tape 100. The distance K4 corresponds to the length in the width direction (X-axis direction) of the travel path 5.

As illustrated in FIG. 4, the travel path 5, which is formed along the guide faces 411 of the pair of guide walls 41, includes a first path part 51, a second path part 52, and a third path part 53. The first path part 51 in the travel path 5 is a path including a slope part which is inclined to one direction side (the −Z direction side, the lower direction side) in the Z-axis direction (the first direction, the upper-lower direction) which is perpendicular to the width direction of the travel path 5 (the X-axis direction) and the tape feeding direction H from the upstream side toward the downstream side in the tape feeding direction H. The first path part 51 includes a first region 511 which is located on the most upstream side in the tape feeding direction H, a second region 512 which is continuous with the downstream side in the tape feeding direction H of the first region 511, and a third region 513 which is continuous with the downstream side in the tape feeding direction H of the second region 512. The details of the shape of the first path part 51 will be described below.

The second path part 52 in the travel path 5 is a path which is continuous with the upstream side in the tape feeding direction H of the first path part 51. In the present embodiment, the second path part 52 horizontally extends from the upstream side toward the downstream side in the tape feeding direction H.

The third path part 53 in the travel path 5 is a path which is continuous with the downstream side in the tape feeding direction H of the first path part 51 and leads to the component extracting position 21. In the present embodiment, the third path part 53 includes a horizontal region 531 and an inclined region 532. The horizontal region 531 is a region part which is continuous with the third region 513 of the first path part 51 and horizontally extends in the tape feeding direction H. The downstream end in the tape feeding direction H of the horizontal region 531 in the third path part 53 corresponds to the component extracting position 21 in the tape feeding direction H. In this manner, the configuration in which the component extracting position 21 is located in the horizontal region 531, which is a horizontal region part in the third path part 53, improves the accuracy of extracting the component P from the component storage tape 100 at the component extracting position 21. The inclined region 532 is a region part which is continuous with the downstream side in the tape feeding direction H of the horizontal region 531 and inclined downward.

Each of the first to sixth guide rollers 42, 43, 44, 45, 46, 47 of the tape travel path forming unit 4 is a pair of rollers which is separated from each other in the X-axis direction and rotatable around an axis extending in the X-axis direction. The first to sixth guide rollers 42, 43, 44, 45, 46, 47 form the first path part 51 in the travel path 5 together with the guide faces 411 of the pair of guide walls 41.

The first guide roller 42 is disposed on the upstream end in the tape feeding direction H of the first region 511 in the first path part 51. The first guide roller 42 slightly projects to the +Z direction side (the upper direction side) with respect to the guide faces 411 of the pair of guide walls 41. The first guide roller 42 guides both the ends in the X-axis direction of the face on the −Z direction side (the lower face) of the component storage tape 100 which is fed by the tape feeding unit 3.

The second guide roller 43 is disposed on the downstream side in the tape feeding direction H with respect to the first guide roller 42 in the first region 511 in the first path part 51. The second guide roller 43 slightly projects to the +Z direction side (the upper direction side) with respect to the guide faces 411 of the pair of guide walls 41. The second guide roller 43 guides both the ends in the X-axis direction of the face on the −Z direction side (the lower face) of the component storage tape 100 which is fed by the tape feeding unit 3.

The third guide roller 44 is disposed facing the second guide roller 43 in the first region 511 in the first path part 51. The third guide roller 44 guides both ends in the X-axis direction of a face on the +Z direction side (the upper face) of the component storage tape 100 which is fed by the tape feeding unit 3.

The fourth guide roller 45 is disposed facing the guide faces 411 of the pair of guide walls 41 in the second region 512 in the first path part 51. The fourth guide roller 45 guides both the ends in the X-axis direction of the face on the +Z direction side (the upper face) of the component storage tape 100 which is fed by the tape feeding unit 3.

The fifth guide roller 46 is disposed facing the guide faces 411 of the pair of guide walls 41 on the downstream side in the tape feeding direction H with respect to the fourth guide roller 45 in the second region 512 in the first path part 51. The fifth guide roller 46 guides both the ends in the X-axis direction of the face on the +Z direction side (the upper face) of the component storage tape 100 which is fed by the tape feeding unit 3.

The sixth guide roller 47 is disposed facing the guide faces 411 of the pair of guide walls 41 in the third region 513 in the first path part 51. The sixth guide roller 47 guides both the ends in the X-axis direction of the face on the +Z direction side (the upper face) of the component storage tape 100 which is fed by the tape feeding unit 3.

As described above, each of the first to sixth guide rollers 42, 43, 44, 45, 46, 47 is rotatable around the axis extending in the X-axis direction. Thus, it is possible to reduce a frictional force which is generated when the first to sixth guide rollers 42, 43, 44, 45, 46, 47 guide the component storage tape 100 fed by the tape feeding unit 3. Thus, it is possible to reduce a traveling resistance when the component storage tape 100 travels on the first path part 51 which is formed from the first to sixth guide rollers 42, 43, 44, 45, 46, 47 and the guide faces 411 of the pair of guide walls 41.

Although the tape travel path forming unit 4 which includes the first to sixth guide rollers 42, 43, 44, 45, 46, 47 and the pair of guide walls 41 has been described above, the tape travel path forming unit 4 is not limited to such a configuration. For example, the tape travel path forming unit 4 may have a configuration in which a plurality of pairs of rollers opposed in the Z-axis direction are arrayed.

The configuration of the tape feeding unit 3 will be specifically described with reference to FIGS. 1 to 3. The tape feeding unit 3 includes a first feeding unit 31, the second feeding unit 32, and the third feeding unit 33.

The first feeding unit 31 is disposed on the upstream end in the tape feeding direction H of the second path part 52 in the travel path 5. The first feeding unit 31 feeds the component storage tape 100 with its tip being a free end to cause the component storage tape 100 to travel on the second path part 52 and the first path part 51. The first feeding unit 31 includes a pair of the first sprockets 311, a pair of first worm wheels 312, a pair of first worms 313, a first servomotor 314, a first belt 315, and a first tension roller 316.

The pair of first sprockets 311 is a pair of disc-like sprockets which is supported on the device body 2 rotatably around an axis extending in the X-axis direction. The pair of first sprockets 311 is provided with a plurality of teeth 311a which are arrayed at predetermined intervals in the circumferential direction. Each of the teeth 311a of the pair of first sprockets 311 is engageable with the engagement holes 101b which are formed on both the ends in the width direction of the carrier tape 101 of the component storage tape 100. Further, a one-way clutch which transmits torque only in one direction is incorporated in the pair of first sprockets 311.

Each of the first worm wheels 312 is a worm gear which is disposed coaxially with each of the pair of first sprockets 311. Each of the pair of first worms 313 is a screw-like gear which is meshed with each of the pair of first worm wheels 312.

The first servomotor 314 is a driving source which produces a driving force for rotating the pair of first sprockets 311. The first servomotor 314 includes a motor output shaft 314a for outputting the driving force. The first belt 315 is an endless belt and stretched between the motor output shaft 314a and the pair of first worms 313. The first belt 315 circularly travels by the rotation of the first servomotor 314. The first tension roller 316 abuts on the outer peripheral face of the first belt 315 and applies a tension to the first belt 315.

In the first feeding unit 31 configured as described above, a rotary driving force of the first servomotor 314 is transmitted to the pair of first worm wheels 312 through the first belt 315 and the pair of first worms 313. Accordingly, the pair of first worm wheels 312 rotates. When the pair of first worm wheels 312 rotates, the pair of first sprockets 311 rotates in conjunction with the rotation of the pair of first worm wheels 312. When the pair of first sprockets 311 rotates, the component storage tape 100 which includes the carrier tape 101 having the engagement holes 101b which are engaged with the teeth 311a of the first sprockets 311 is fed.

The second feeding unit 32 is disposed on the downstream end in the tape feeding direction H of the first path part 51 in the travel path 5, in other words, on the upstream end in the tape feeding direction H of the third path part 53. The second feeding unit 32 receives the component storage tape 100 which is fed by the first feeding unit 31 and travels on the first path part 51 and feeds the component storage tape 100 toward the component extracting position 21. Accordingly, the second feeding unit 32 causes the component storage tape 100 to travel on the third path part 53.

In a manner similar to the first feeding unit 31, the second feeding unit 32 includes the pair of second sprockets 321, a pair of second worm wheels 322, a pair of second worms 323, a second servomotor 324, a second belt 325, and a second tension roller 326.

The pair of second sprockets 321 is a pair of disc-like sprockets which is supported on the device body 2 rotatably around an axis extending in the X-axis direction. The pair of second sprockets 321 is provided with a plurality of teeth 321a which are arrayed at predetermined intervals in the circumferential direction. In the pair of second sprockets 321, the teeth 321a located on the other direction side (the +Z direction side, the upper side) in the Z-axis direction (the first direction, the upper-lower direction) are exposed from the guide faces 411 of the pair of guide walls 41. Each of the teeth 321a of the pair of second sprockets 321 is engageable with the engagement holes 101b which are formed on both the ends in the width direction of the carrier tape 101 of the component storage tape 100.

Each of the pair of second worm wheels 322 is a worm gear which is disposed coaxially with each of the pair of second sprockets 321. Each of the pair of second worms 323 is a screw-like gear which is meshed with each of the pair of second worm wheels 322.

The second servomotor 324 is a driving source which produces a driving force for rotating the pair of second sprockets 321. The second servomotor 324 includes a motor output shaft 324a for outputting the driving force. The second belt 325 is an endless belt and stretched between the motor output shaft 324a and the pair of second worms 323. The second belt 325 circularly travels by the rotation of the second servomotor 324. The second tension roller 326 abuts on the outer peripheral face of the second belt 325 and applies a tension to the second belt 325.

In the second feeding unit 32 configured as described above, a rotary driving force of the second servomotor 324 is transmitted to the pair of second worm wheels 322 through the second belt 325 and the pair of second worms 323. Accordingly, the pair of second worm wheels 322 rotates. When the pair of second worm wheels 322 rotates, the pair of second sprockets 321 rotates in conjunction with the rotation of the pair of second worm wheels 322. When the pair of second sprockets 321 rotates, the component storage tape 100 which includes the carrier tape 101 having the engagement holes 101b which are engaged with the teeth 321a of the second sprockets 321 is fed.

When the tip of the component storage tape 100 fed by the first feeding unit 31 arrives at the pair of second sprockets 321, and the engagement holes 101b of the carrier tape 101 on the tip of the component storage tape 100 are engaged with the teeth 321a of the pair of second sprockets 321, the first servomotor 314 stops. When the first servomotor 314 stops in this manner, a rotation shaft of the first sprockets 311 stops. However, the first sprockets 311 can rotate in conjunction with the movement of the component storage tape 100, which is fed by the rotation of the pair of second sprockets 321, by the one-way clutch interposed between the rotation shaft and the first sprockets 311 without the rotation of the rotation shaft.

The third feeding unit 33 is disposed on the downstream end in the tape feeding direction H of the horizontal region 531 in the third path part 53 of the travel path 5. That is, the third feeding unit 33 is disposed at the position corresponding to the component extracting position 21 in the tape feeding direction H. The third feeding unit 33 receives the component storage tape 100 which is fed by the second feeding unit 32 and travels on the third path part 53 and feeds the component storage tape 100 so that the component storage tape 100 passes through the component extracting position 21. The configuration in which the third feeding unit 33 is disposed at the position corresponding to the component extracting position 21 in the tape feeding direction H and receives the component storage tape 100 makes it possible to feed the component storage tape 100 positioned with respect to the component extracting position 21 with high accuracy.

The third feeding unit 33 includes the pair of third sprockets 331 and a pair of third worm wheels 332. In the above description, "the third feeding unit 33 is disposed at the position corresponding to the component extracting position 21" indicates that the third feeding unit 33 is disposed in such a manner that the component extracting position 21 is located within the range of the pair of third sprockets 331 in the tape feeding direction H when viewed in the width direction of the travel path 5 (the X-axis direction). When viewed in the width direction of the travel path 5 (the X-axis direction), the component extracting position 21 is desirably located immediately above the top (the uppermost end) of the pair of third sprockets 331. When the component extracting position 21 is located at a position shifted in the Y-axis direction from the top of the pair of third sprockets 331, it is preferred that the position be shifted to the upstream side in the tape feeding direction H rather than to the downstream side. This is because a region part passing through the component extracting position 21 in the component storage tape 100 fed by the pair of third sprockets 331 of the third feeding unit 33 is brought into a pulled state, and deformation in the region part is thus small and the component storage tape 100 is positioned with respect to the component extracting position 21 with high accuracy.

The pair of third sprockets 331 is a pair of disc-like sprockets which is supported on the device body 2 rotatably around an axis extending in the X-axis direction. The pair of third sprockets 331 is provided with a plurality of teeth 331a which are arrayed at predetermined intervals in the circumferential direction. In the pair of third sprockets 331, the teeth 331a located on the other direction side (the +Z direction side, the upper side) in the Z-axis direction (the first direction, the upper-lower direction) are exposed from the guide faces 411 of the pair of guide walls 41. Each of the teeth 331a of the pair of third sprockets 331 is engageable with the engagement holes 101b which are formed on both the ends in the width direction of the carrier tape 101 of the component storage tape 100.

Each of the pair of third worm wheels 332 is a worm gear which is disposed coaxially with each of the pair of third sprockets 331. Each of the pair of third worm wheels 332 is meshed with each of the pair of second worm 323.

In the third feeding unit 33 configured as described above, in a manner similar to the second feeding unit 32, a rotary driving force of the second servomotor 324 is transmitted to the pair of third worm wheels 332 through the second belt 325 and the pair of second worms 323. Accordingly, the pair of third worm wheels 332 rotates. When the pair of third worm wheels 332 rotates, the pair of third sprockets 331 rotates in conjunction with the rotation of the pair of third worm wheels 332. When the pair of third sprockets 331 rotates, the component storage tape 100 which includes the carrier tape 101 having the engagement holes 101b which are engaged with the teeth 331a of the third sprockets 331 is fed.

Next, the configuration of the component exposing unit 6 included in the component supply device 1 will be described with reference to FIG. 5. The component exposing unit 6 is disposed on the travel path 5 formed from the tape travel path forming unit 4. The component exposing unit 6 exposes the components P inside the component storage parts 101a of the component storage tape 100 which is fed by the tape feeding unit 3 and travels on the travel path 5. The component exposing unit 6 includes a cover tape raising unit 61, a cover tape pre-process unit 62, and a cover tape post-process unit 63.

FIG. 6 is a diagram illustrating the configuration of the cover tape raising unit 61 in the component exposing unit 6. The cover tape raising unit 61 is disposed on the first path part 51 on the travel path 5. The cover tape raising unit 61 performs a raising process for raising the cover tape 102 to the +Z direction side (the upper direction side) with respect to the carrier tape 101 by coming into contact with the cover tape 102 of the component storage tape 100 traveling on the first path part 51 of the travel path 5. The raising process for the cover tape 102 by the cover tape raising unit 61 exposes the components P inside the component storage parts 101a of the component storage tape 100.

In the present embodiment, the cover tape raising unit 61 comes into contact with a cut part 102a of the cover tape 102 cut by a cover tape cutting member 622 included in the cover tape pre-process unit 62 (described below) to perform the raising process for the cut cover tape 102. The cover tape cutting member 622 of the cover tape pre-process unit 62 cuts the cover tape 102 at a predetermined position (e.g., a central position) between the ends in the width direction of the cover tape 102. Further, the cut part 102a of the cover tape 102 cut by the cover tape cutting member 622 linearly extends along the travel path 5.

The cover tape raising unit 61 includes a raised region expanding part 611 and a raised region holding part 612.

The raised region expanding part 611 is a region part on the upstream side in the tape feeding direction H in the cover tape raising unit 61. The tip of an upstream end 611A in the tape feeding direction H of the raised region expanding part 611 constitutes a most upstream end 61A of the cover tape raising unit 61 and serves as a starting point of the contact with the cover tape 102. The raised region expanding part 611 expands a raised region of the cover tape 102 to the +Z direction side (the upper direction side) with respect to the carrier tape 101 to a range from a raising starting point to the fused parts 103. The raising starting point of the cover tape 102 is a starting point of the contact with the most upstream end 61A of the cover tape raising unit 61 in the cover tape 102 and, in the present embodiment, located on the cut part 102a of the cover tape 102 cut by the cover tape cutting member 622. Further, the upstream end 611A in the tape feeding direction H of the raised region expanding part 611 is fixed to the cover member 7 (described below).

The raised region expanding part 611 includes a first region expanding piece 6111 and a second region expanding piece 6112. The first region expanding piece 6111 and the second region expanding piece 6112 are plate-like members each having a predetermined length in the tape feeding direction H and connected to each other at their upstream ends in the tape feeding direction H. The connected part between the first region expanding piece 6111 and the second region expanding piece 6112 constitutes the upstream end 611A in the tape feeding direction H of the raised region expanding part 611.

The first region expanding piece 6111 extends in a manner to approach an end on one direction side (the +X direction side) in the width direction (the X-axis direction) in the travel path 5 from the upstream end in the tape feeding direction H as the part connected with the second region expanding piece 6112 toward the downstream end. The upstream end in the tape feeding direction H of the first region expanding piece 6111 comes into contact with the cut part 102a of the cut cover tape 102. An edge on the −Z direction side of the downstream end in the tape feeding direction H of the first region expanding piece 6111 comes into contact with a boundary between one direction side (the +X direction side) in the width direction of the cover tape 102 and the fused part 103.

The second region expanding piece 6112 extends in a manner to approach an end on the other direction side (the −X direction side) in the width direction (the X-axis direction) in the travel path 5 from the upstream end in the tape feeding direction H as the part connected with the first region expanding piece 6111 toward the downstream end. The upstream end in the tape feeding direction H of the second region expanding piece 6112 comes into contact with the cut part 102a of the cut cover tape 102. An edge on the −Z direction side of the downstream end in the tape feeding direction H of the second region expanding piece 6112 comes into contact with a boundary between the other direction side (the −X direction side) in the width direction of the cover tape 102 and the fused part 103.

The raised region holding part 612 is connected to the downstream end in the tape feeding direction H of the raised region expanding part 611 through a connecting member 613. The raised region holding part 612 is connected to the raised region expanding part 611 swingably about the connecting member 613. A tip of the downstream end in the tape feeding direction H of the raised region holding part 612 constitutes a most downstream end 61B of the cover tape raising unit 61 and serves as an end point of the contact with the cover tape 102. The raised region holding part 612 holds the raised region of the cover tape 102, the raised region being expanded to the range leading to the fused parts 103 by the raised region expanding part 611, as it is. The cover tape raising unit 61 having the configuration in which the raised region holding part 612 is connected to the raised region expanding part 611 swingably about the connecting member 613 is swingable in response to a change in a traveling behavior of the component storage tape 100 on the first path part 51. Thus, reduction in the stability of the raising process for the cover tape 102 by the cover tape raising unit 61 is prevented. The change in the traveling behavior of the component storage tape 100 on the first path part 51 will be described below.

The raised region holding part 612 includes a first region holding piece 6121 and a second region holding piece 6122. The first region holding piece 6121 and the second region holding piece 6122 are plate-like members each having a predetermined length in the tape feeding direction H.

The first region holding piece 6121 extends along the first path part 51 in the travel path 5 from the upstream end toward the downstream end in the tape feeding direction H. The upstream end in the tape feeding direction H of the first region holding piece 6121 is connected to the downstream end of the first region expanding piece 6111 through the connecting member 613. The first region holding piece 6121 is supported on the device body 2 swingably about the connecting member 613 with respect to the first region expanding piece 6111. The downstream end in the tape feeding direction H of the first region holding piece 6121 constitutes the most downstream end 61B of the cover tape raising unit 61. An edge on the −Z direction side of the first region holding piece 6121 comes into contact with the boundary between one direction side (the +X direction side) in the width direction of the cover tape 102 and the fused part 103.

The second region holding piece 6122 extends along the first path part 51 in the travel path 5 from the upstream end toward the downstream end in the tape feeding direction H. The upstream end in the tape feeding direction H of the second region holding piece 6122 is connected to the downstream end of the second region expanding piece 6112 through the connecting member 613. The second region holding piece 6122 is supported on the device body 2 swingably about the connecting member 613 with respect to the second region expanding piece 6112. The downstream end in the tape feeding direction H of the second region holding piece 6122 constitutes the most downstream end 61B of the cover tape raising unit 61. An edge on the −Z direction side of the second region holding piece 6122 comes into contact with the boundary between the other direction side (the −X direction side) in the width direction of the cover tape 102 and the fused part 103.

Figure 8A:
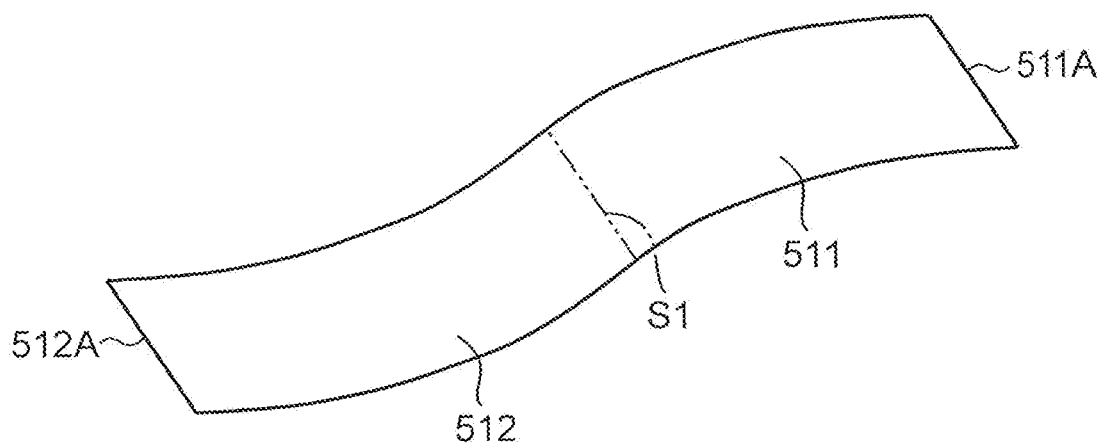
FIGS. 8A, 8B and 8C are diagrams for describing the shapes of a first region and a second region in the first path part of the travel path.
Figure 8B:
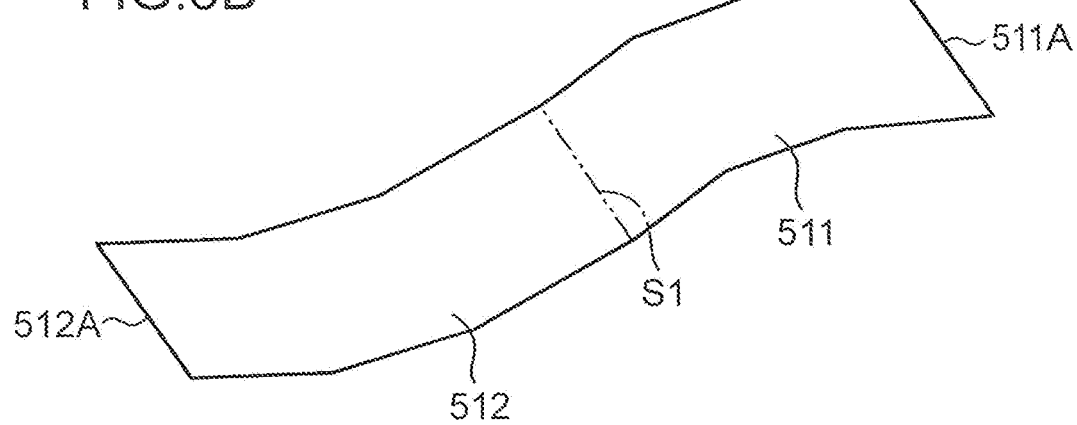
Figure 8C:
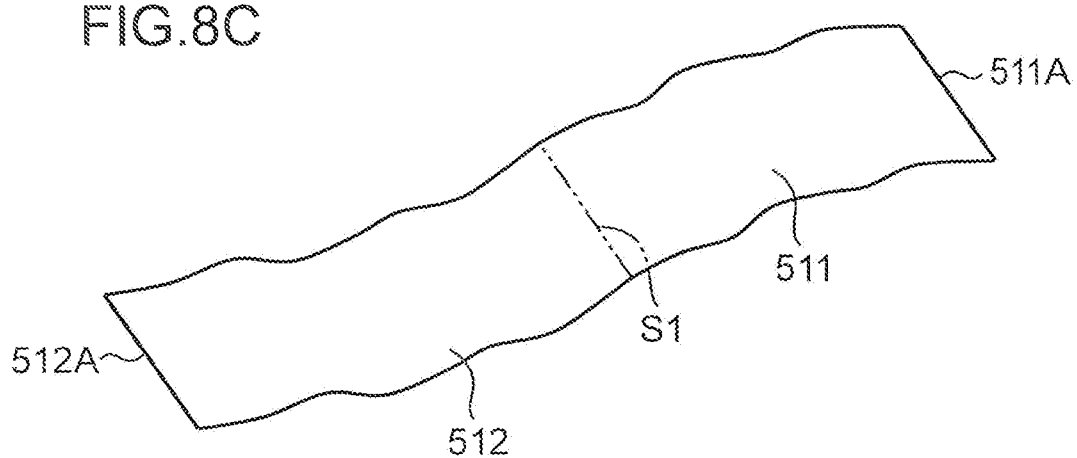
Figure 9:
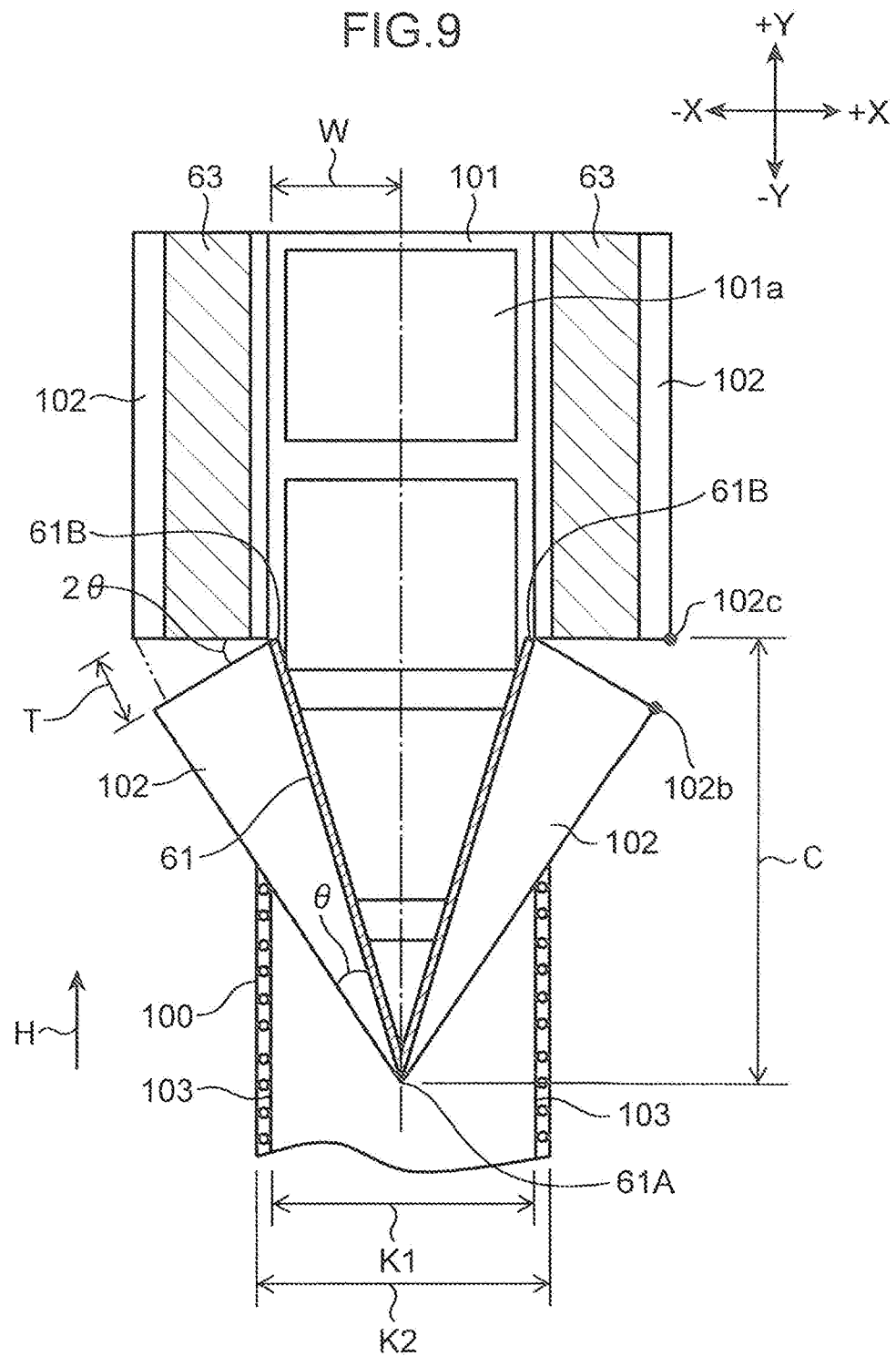
FIG. 9 is a diagram for describing the shape of the second region in the first path part of the travel path.
Figure 10:
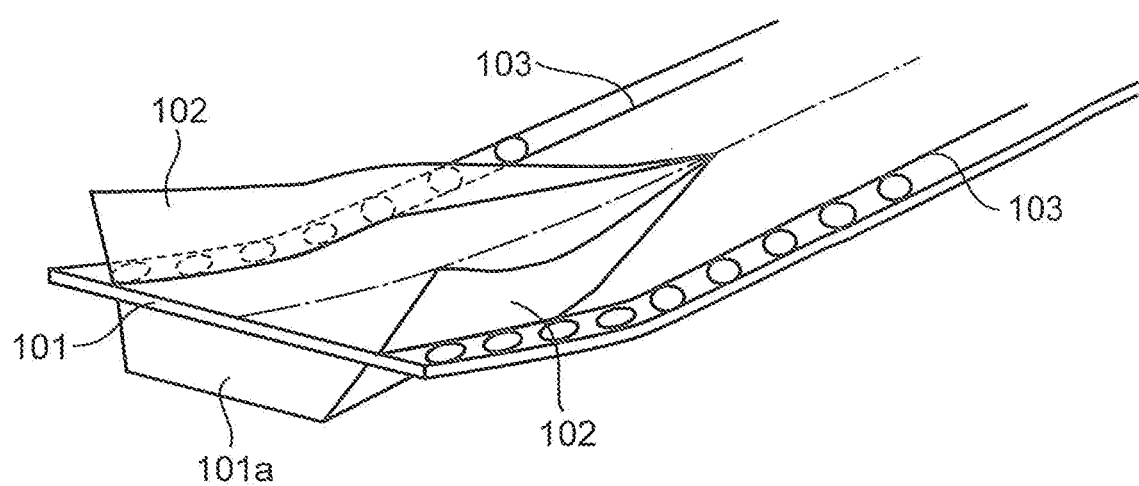
FIG. 10 is a diagram illustrating a state of buckling deformation of a carrier tape during a raising process for a cover tape of the component storage tape.

Next, the shape of the first path part 51 of the travel path 5 on which the cover tape raising unit 61 is disposed and buckling deformation of the carrier tape 101 during the raising process for the cover tape 102 of the component storage tape 100 will be described with reference to FIGS. 7 to 10 in addition to FIG. 6. FIG. 7 is a diagram for describing the shape of the first path part 51 in the travel path 5 formed from the tape travel path forming unit 4. FIGS. 8A, 8B and 8C are diagrams for describing the shapes of the first region 511 and the second region 512 in the first path part 51 of the travel path 5. FIG. 9 is a diagram for describing the shape of the second region 512 in the first path part 51 of the travel path 5. FIG. 10 is a diagram illustrating a state of the buckling deformation of the carrier tape 101 during the raising process for the cover tape 102 of the component storage tape 100.

As illustrated in FIG. 10, the carrier tape 101 may deform in a buckling manner during the raising process for the cover tape 102 by the cover tape raising unit 61. Referring to FIG. 9, it is considered that the buckling deformation of the carrier tape 101 during the raising process for the cover tape 102 occurs due to a gap between a downstream end 102b in the tape feeding direction H of the cover tape 102 raised by the cover tape raising unit 61 and an upstream end 102c in the tape feeding direction H of the cover tape 102 spread out by the cover tape post-process unit 63 (described below).

In the cover tape 102 raised by the cover tape raising unit 61, a tensile stress directing from the downstream end 102b in the tape feeding direction H toward the raising starting point (the starting point of the contact between the cover tape 102 and the most upstream end 61A of the cover tape raising unit 61) is generated by the gap. When the tensile stress is generated in the cover tape 102, the buckling deformation of the carrier tape 101 is caused by the stress.

The size of the gap increases as the length K1 between the fused parts 103 of the component storage tape 100 becomes longer and the raised region of the cover tape 102 by the raising process expands. That is, a deformation amount of the buckling deformation of the carrier tape 101 increases as the raised region of the cover tape 102 by the raising process expands. Further, the size of the gap increases as the length C in the cover tape raising unit 61 along the first path part 51 becomes shorter and a travel distance of the component storage tape 100 during the raising of the cover tape 102 becomes shorter. That is, the deformation amount of the buckling deformation of the carrier tape 101 increases as the travel distance of the component storage tape 100 during the raising of the cover tape 102 becomes shorter.

For example, when the size of the component storage parts 101a is increased to supply large components P, the length K1 between the fused parts 103 becomes long. When the large components P are supplied using such a component storage tape 100, the possibility of the occurrence of buckling deformation increases in view of the above behavior relating to the buckling deformation of the carrier tape 101. In this case, the buckling deformation of the carrier tape 101 can be prevented by increasing the travel distance of the component storage tape 100 during the raising of the cover tape 102.

In the present embodiment, as described above, the first path part 51 on which the cover tape raising unit 61 is disposed is inclined to one direction side (the −Z direction side, the lower direction side) in the Z-axis direction (the first direction, the upper-lower direction) which is perpendicular to the width direction of the travel path 5 (the X-axis direction) and the tape feeding direction H from the upstream side toward the downstream side in the tape feeding direction H. Accordingly, it is possible to increase the travel distance of the component storage tape 100 when the component storage tape 100 travels on the first path part 51 and passes through the cover tape raising unit 61 as compared to a case where, for example, the cover tape raising unit 61 is disposed on a travel path horizontally extending in the tape feeding direction H.

Further, the first path part 51 is not configured in such a manner that the most upstream end and the most down stream end in the tape feeding direction H are located at the same height position like the above conventional technique. Thus, in the cover tape 102 raised by the cover tape raising unit 61, the generation of the tensile stress directing from the downstream end 102b in the tape feeding direction H toward the raising starting point is prevented. Thus, it is possible to prevent the buckling deformation of the carrier tape 101, the buckling deformation being caused by the tensile stress of the cover tape 102, during the raising process for the cover tape 102 by the cover tape raising unit 61. Thus, an excellent traveling performance of the component storage tape 100 is maintained, and the components P can be efficiently supplied toward the component extracting position 21.

Further, in the component supply device 1 having the configuration capable of preventing the buckling deformation of the carrier tape 101 during the raising process for the cover tape 102, it is possible to reduce the length in the tape feeding direction H of the first path part 51 on which the cover tape raising unit 61 is disposed, that is, the length in the tape feeding direction H from the most upstream end to the most downstream end of the first path part 51. Thus, the component supply device 1 can be downsized.

Further, as illustrated in FIGS. 6 and 7, the first path part 51 on which the cover tape raising unit 61 is disposed includes the first region 511 on the most upstream side in the tape feeding direction H, the second region 512 which is continuous with the downstream side in the tape feeding direction H of the first region 511, and the third region 513 which is continuous with the downstream side in the tape feeding direction H of the second region 512 as described above.

In the first path part 51, a path part from the most upstream end 511A in the tape feeding direction H of the first region 511 to the most downstream end 512A in the tape feeding direction H of the second region 512 is formed in a shape extending along a virtual curve having an inflection point F12 when viewed in the width direction of the travel path 5 (the X-axis direction). Specifically, the first region 511 of the first path part 51 is formed in a shape extending along a first virtual curve F1 which projects in the other direction (the +Z direction, the upper direction) opposite to one direction (the −Z direction, the lower direction) in the Z-axis direction (the first direction, the upper-lower direction) when viewed in the width direction of the travel path 5 (the X-axis direction). The second region 512 of the first path part 51 is formed in a shape extending along a second virtual curve F2 which projects in one direction (the −Z direction, the lower direction) in the Z-axis direction (the first direction, the upper-lower direction) when viewed in the width direction of the travel path 5 (the X-axis direction).

Here, the shape of the path part from the most upstream end 511A in the tape feeding direction H of the first region 511 to the most downstream end 512A in the tape feeding direction H of the second region 512 is not particularly limited to any shape as long as the shape is inclined to the −Z direction side from the upstream side toward the downstream side in the tape feeding direction H. For example, the first region 511 extending along the first virtual curve F1 and the second region 512 extending along the second virtual curve F2 may have an arc shape as illustrated in FIG. 8A, a bent shape including a plurality of segments coupled to each other as illustrated in FIG. 8B, or a curved shape including a plurality of curves coupled to each other as illustrated in FIG. 8C when viewed in the width direction of the travel path 5 (the X-axis direction).

In the first path part 51 viewed in the width direction of the travel path 5 (the X-axis direction), the first region 511 extending along the first virtual curve F1 and the second region 512 extending along the second virtual curve F2 are curved in different directions with respect to the Z-axis direction (the first direction, the upper-lower direction) and have opposite signs of the curvature. When the component storage tape 100 travels along the first path part 51 as described above, a force of bending acts on the component storage tape 100 in opposite directions with respect to the Z-axis direction (the first direction, the upper-lower direction) between when the component storage tape 100 passes through the first region 511 and when the component storage tape 100 passes through the second region 512. Thus, for example, in the first path part 51, when the cover tape raising unit 61 is disposed across the first region 511 and the second region 512, there is a possibility that the stability of the raising process for the cover tape 102 by the cover tape raising unit 61 is reduced.

Thus, as illustrated in FIG. 6, the cover tape raising unit 61 is disposed in such a manner that the most upstream end 61A in the tape feeding direction H as the starting point of the contact with the cover tape 102 is located on or near a boundary line 51 between the first region 511 and the second region 512 in the first path part 51. In such a configuration, since the most upstream end 61A of the cover tape raising unit 61 is located on or near the boundary line 51 between the first region 511 and the second region 512, the cover tape raising unit 61 is not located across the first region 511 and the second region 512, but located in the second region 512. Thus, the reduction in the stability of the raising process for the cover tape 102 by the cover tape raising unit 61 is prevented.

Further, the component storage tape 100 travels while bending in the first region 511 and the second region 512 of the first path part 51. Here, in the component storage tape 100 traveling on the first path part 51, a bending direction during traveling and the traveling behavior on the first path part 51 change at the inflection point F12 between the first virtual curve F1 extending along the first region 511 and the second virtual curve F2 extending along the second region 512 between when the component storage tape 100 is fed by the first feeding unit 31 which is disposed on the upstream side of the first path part 51 and when the component storage tape 100 is fed by the second feeding unit 32 which is disposed on the downstream side of the first path part 51. Such a change in the traveling behavior of the component storage tape 100 on the first path part 51 occurs not only in the loading operation in which the component storage tape 100 is fed in the tape feeding direction H toward the component extracting position 21, but also in the unloading operation in which the component storage tape 100 is fed in the −Y direction which is opposite to the tape feeding direction H.

Specifically, in the loading operation, the component storage tape 100 fed by the first feeding unit 31 bends to the +Z direction side (the upper direction side) in the first region 511 and bends to the −Z direction side (the lower direction side) in the second region 512. Further, the component storage tape 100 fed by the second feeding unit 32 bends to the −Z direction side (the lower direction side) in the first region 511 and bends to the +Z direction side (the upper direction side) in the second region 512.

In the cover tape raising unit 61 of the present embodiment, as described above, only the upstream end 611A of the raised region expanding part 611 is fixed to the cover member 7 (described below), and the raised region holding part 612 is connected to the raised region expanding part 611 swingably about the connecting member 613. Accordingly, the cover tape raising unit 61 is swingable in response to the change in the traveling behavior of the component storage tape 100 on the first path part 51. Thus, the reduction in the stability of the raising process for the cover tape 102 by the cover tape raising unit 61 is prevented.

Further, as illustrated in FIG. 4, the first path part 51 is formed from the first to sixth guide rollers 42, 43, 44, 45, 46, 47 together with the guide faces 411 of the pair of guide walls 41 as described above. Each of the first to sixth guide rollers 42, 43, 44, 45, 46, 47 is rotatable around the axis extending in the X-axis direction. Thus, even when the traveling behavior of the component storage tape 100 on the first path part 51 changes, it is possible to reduce the traveling resistance of the component storage tape 100 when the component storage tape 100 travels on the first path part 51.

Further, when the component storage tape 100 travels on the first path part 51, the face on the −Z direction side (the lower face) thereof is guided by the guide faces 411 of the pair of guide walls 41 and the first guide roller 42 and the second guide roller 43. On the other hand, the face on the +Z direction side (the upper face) of the component storage tape 100 is guided by the third to sixth guide rollers 44, 45, 46, 47. That is, the tape travel path forming unit 4 is not provided with a guide wall having a continuous guide face as a configuration for guiding the face on the +Z direction side (the upper face) of the component storage tape 100 in order to more reliably reduce the traveling resistance when the traveling behavior of the component storage tape 100 on the first path part 51 changes.

Next, a configuration for more reliably preventing the buckling deformation of the carrier tape 101 during the raising process for the cover tape 102 will be described with reference to FIGS. 7 and 9. It is desired that the shape of the second region 512 of the first path part 51 on which the cover tape raising unit 61 is disposed on the travel path 5 be designed on the basis of a threshold T (refer to FIG. 9) corresponding to the gap between the downstream end 102b in the tape feeding direction H of the cover tape 102 raised by the cover tape raising unit 61 and the upstream end 102c in the tape feeding direction H of the cover tape 102 spread out by the cover tape post-process unit 63 (described below). As illustrated in FIG. 9, the threshold T can be obtained from the following equation (1).

$$T = W \cdot \sin 2\theta = 2W \cdot \sin \theta \cdot \cos \theta \tag{1}$$

In the above equation (1), "W" denotes a distance in the width direction of the travel path 5 (the X-axis direction) between the most upstream end 61A in the tape feeding direction H as the starting point of the contact with the cover tape 102 and the most downstream end 61B in the tape feeding direction H as the end point of the contact with the cover tape 102 in the cover tape raising unit 61. Further, in the above equation (1), "θ" denotes an angle around the raising starting point of the cover tape 102 raised by the cover tape raising unit 61 (the starting point of the contact with the most upstream end 61A of the cover tape raising unit 61 in the cover tape 102) as illustrated in FIG. 9.

Further, as illustrated in FIG. 9, "sin θ" and "cos θ" in the above equation (1) are obtained from the following equations (2) and (3), respectively.

$$\sin \theta = W / \sqrt{(C^2 + W^2)} \tag{2}$$

$$\cos \theta = C / \sqrt{(C^2 + W^2)} \tag{3}$$

In the above equations (2) and (3), "C" denotes a length along the second region 512 of the first path part 51 in the cover tape raising unit 61.

The following equation (I) is obtained as an equation that defines the threshold T by substituting "sin θ" represented by equation (2) and "cos θ" represented by equation (3) into equation (1).

$$T=2C\cdot W^2/(C^2+W^2) \quad (I)$$

Further, in the present embodiment, a difference value (L−d) between a length L of an arc (corresponding to the second virtual curve F2) and a length d of a chord F5 in a sector F4 (a central angle α) corresponding to the second virtual curve F2 which defines the shape of the second region 512 of the first path part 51 on which the cover tape raising unit 61 is disposed on the travel path 5 is set to be larger than the threshold T defined by the above equation (I). Accordingly, during the raising process for the cover tape 102 by the cover tape raising unit 61 which is disposed on the second region 512 of the first path part 51, it is possible to more reliably prevent the buckling deformation of the carrier tape 101, the buckling deformation being caused by the tensile stress of the cover tape 102.

Further, as illustrated in FIGS. 6 and 7, the third region 513 which is continuous with the downstream side in the tape feeding direction H of the second region 512 on which the cover tape raising unit 61 is disposed in the first path part 51 is formed in a shape extending along a third virtual curve F3 which projects in the +Z direction (the upper direction) when viewed in the width direction of the travel path 5 (the X-axis direction).

As described above, the second feeding unit 32 which is provided with the pair of second sprockets 321 is disposed on a most downstream end 513A in the tape feeding direction H of the third region 513, the most downstream end 513A corresponding to the most downstream end in the tape feeding direction H of the first path part 51 in the travel path 5. The third region 513 is formed in the shape extending along the third virtual curve F3 which projects in the +Z direction (the upper direction) in order to improve an engagement performance of the engagement holes 101b of the carrier tape 101 on the tip of the component storage tape 100 which is fed by the first feeding unit 31 and travels in the third region 513 with the teeth 321a of the pair of second sprockets 321. The tape feeding unit 3 is not necessarily provided with the second feeding unit 32. However, when the tape feeding unit 3 is provided with the second feeding unit 32, the teeth 321a of the second sprockets 321 are fitted in and engaged with the engagement holes 101b of the component storage tape 100 which is fed by the first feeding unit 31 and travels on the first path part 51, which enables the component storage tape 100 to be reliably received. Further, the second feeding unit 32 makes it possible to reliably feed the component storage tape 100 received by the second feeding unit 32 toward the third feeding unit 33 which is disposed at the position corresponding to the component extracting position 21 in the third path part 53 on the downstream side in the tape feeding direction H of the first path part 51.

The height position of the most downstream end 513A in the tape feeding direction H of the third region 513 is set taking into consideration the engagement performance of the engagement holes 101b of the carrier tape 101 with respect to the teeth 321a of the pair of second sprockets 321 and an effect of preventing the buckling deformation of the carrier tape 101 during the raising process for the cover tape 102. The height position of the most downstream end 513A of the third region 513 is set to be different from the height position of the most upstream end 511A of the first region 511, the most upstream end 511A corresponding to the most upstream end in the tape feeding direction H of the first path part 51.

That is, as illustrated in FIG. 7, a distance K6 in the Z-axis direction (the upper-lower direction) between the most downstream end 512A of the second region 512 and the most downstream end 513A of the third region 513 is set to be shorter than a distance K5 in the Z-axis direction (the upper-lower direction) between the most upstream end 511A of the first region 511 and the most downstream end 512A of the second region 512. When the tape feeding unit 3 is not provided with the second feeding unit 32, the first path part 51 may not include the third region 513 and horizontally extend from the most downstream end 512A of the second region 512 toward the third path part 53. Alternatively, the second feeding unit 32 may be disposed on a part horizontally extending from the most downstream end 512A of the second region 512.

Further, as described above, the sixth guide roller 47 which guides both the ends in the X-axis direction of the face on the +Z direction side (the upper face) of the component storage tape 100 is disposed on the third region 513 of the first path part 51. The sixth guide roller 47 guides the component storage tape 100 such that the tip of the component storage tape 100 which is fed by the first feeding unit 31 and travels in the third region 513 comes into contact with the roots of the teeth 321a of the pair of second sprockets 321. Accordingly, it is possible to achieve an excellent engagement performance of the engagement holes 101b of the carrier tape 101 on the tip of the component storage tape 100 with the teeth 321a of the pair of second sprockets 321.

Next, the cover tape pre-process unit 62 and the cover tape post-process unit 63 of the component exposing unit 6 will be described with reference to FIGS. 1 and 5.

The cover tape pre-process unit 62 is disposed on the second path part 52, which is continuous with the upstream side in the tape feeding direction H of the first path part 51 in the travel path 5, away from the cover tape raising unit 61. The cover tape pre-process unit 62 performs a pre-process for cutting the cover tape 102 on the component storage tape 100 which is fed by the first feeding unit 31 and travels on the second path part 52 with its tip being a free end prior to the raising process for the cover tape 102 by the cover tape raising unit 61. Accordingly, the cover tape raising unit 61 smoothly comes into contact with the cover tape 102 of the component storage tape 100, and the raising process for the cover tape 102 by the cover tape raising unit 61 is smoothly performed.

Further, the component storage tape 100 is fed by the first feeding unit 31 with its tip being a free end and travels on the second path part 52 and the first path part 51 from the upstream side toward the downstream side of the travel path 5. Here, the cover tape pre-process unit 62 is disposed on the second path part 52 away from the cover tape raising unit 61 which is disposed on the first path part 51. Thus, when the component storage tape 100 travels on the second path part 52 on the upstream side of the first path part 51 in the travel path 5 and passes through the cover tape pre-process unit 62, the raising process has not yet been performed on the cover tape 102 of the component storage tape 100. As a result, in the component storage tape 100 traveling on the second path part 52 on which the cover tape pre-process unit 62 is disposed, it is possible to prevent the buckling deformation of the carrier tape 101, the buckling deformation being caused by the tensile stress of the cover tape 102 associated with the raising process.

The component storage tape 100 after the raising process for the cover tape 102 by the cover tape raising unit 61 is fed to the third path part 53 on the downstream side of the first path part 51 in the travel path 5 by the second feeding unit 32. The cover tape post-process unit 63 is disposed on the third path part 53. The cover tape post-process unit 63 performs a post-process for spreading out the cover tape 102 raised by the cover tape raising unit 61 in the width direction of the component storage tape 100. Accordingly, an exposed degree of the component P inside the component storage part 101a of the component storage tape 100 increases. Thus, it is possible to improve a removal performance for the component P at the component extracting position 21.

Figure 11A:
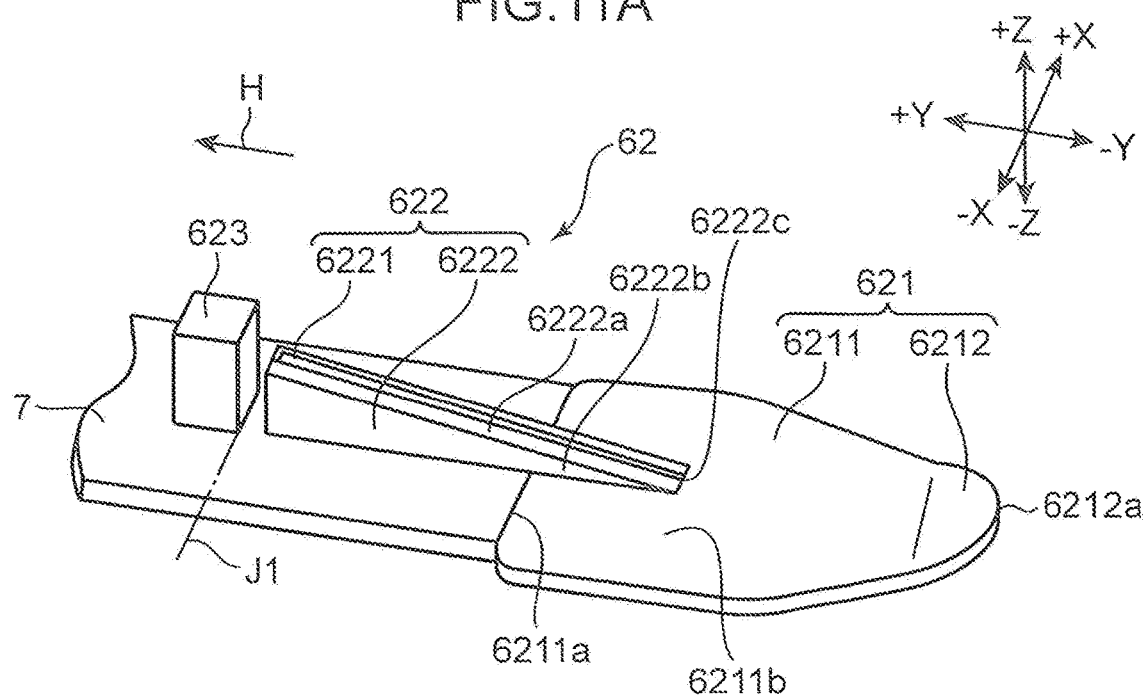
FIGS. 11A and 11B are diagrams illustrating the configuration of a cover tape pre-process unit in the component exposing unit.
Figure 11B:
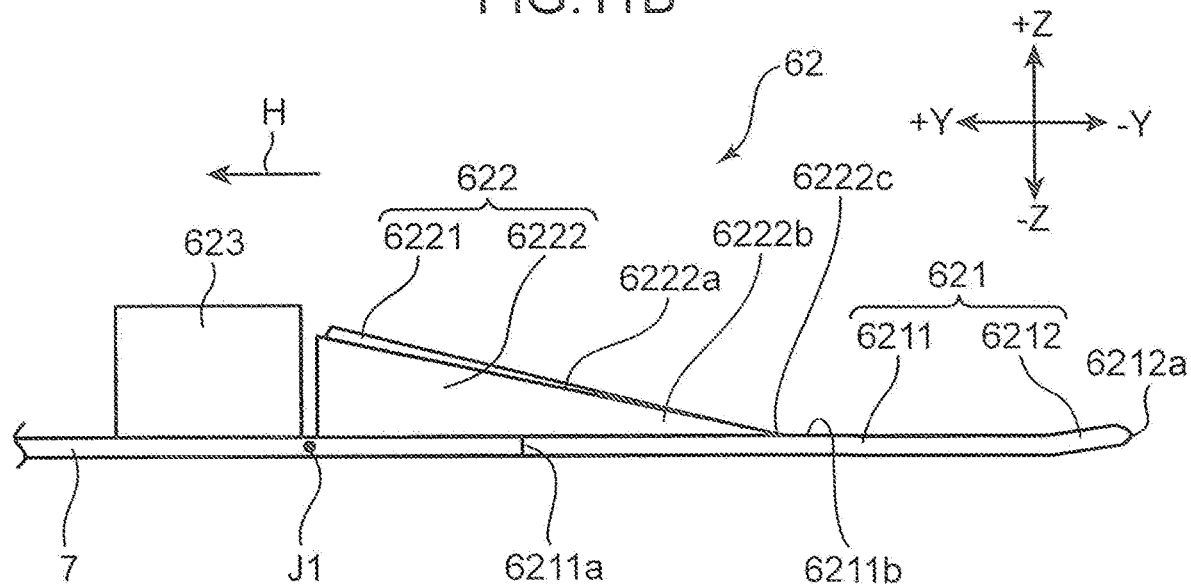

The detailed configuration of the cover tape pre-process unit 62 of the component exposing unit 6 will be described with reference to FIGS. 11A and 11B. FIGS. 11A and 11B are diagrams illustrating the configuration of the cover tape pre-process unit 62 of the component exposing unit 6. The cover tape pre-process unit 62 includes an insertion member 621, a cover tape cutting member 622, and a support member 623.

The insertion member 621 is inserted between the cover tape 102 and the carrier tape 101 in the component storage tape 100 which is fed by the first feeding unit 31 with its tip being a free end and travels on the second path part 52. The insertion member 621 is formed in a flat-plate shape. The insertion member 621 includes a base part 6211 and a tip part 6212 which is continuous with the upstream end in the tape feeding direction H of the base part 6211. The cover member 7 (described below) is connected to a downstream end 6211a in the tape feeding direction H of the base part 6211 of the insertion member 621.

Figure 12:
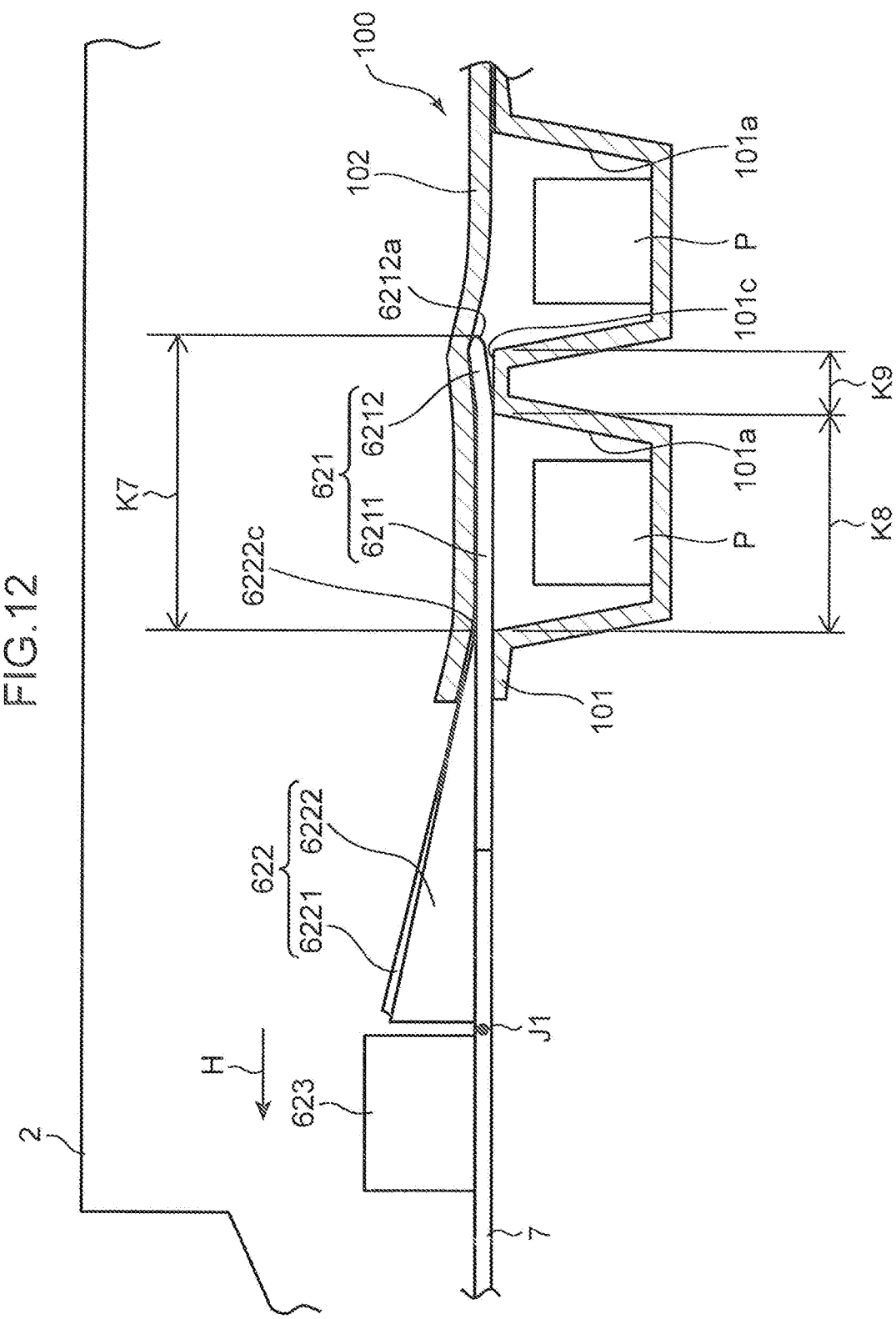
FIG. 12 is a diagram illustrating a state in which an insertion member of the cover tape pre-process unit is inserted between the cover tape and the carrier tape of the component storage tape.

FIG. 12 is a diagram illustrating a state in which the insertion member 621 of the cover tape pre-process unit 62 is inserted between the cover tape 102 and the carrier tape 101 of the component storage tape 100. In the insertion member 621, the tip part 6212 is inclined upward with respect to the base part 6211 in such a manner that the tip part 6212 is inclined to the other direction side (the +Z direction side, the upper direction side) in the Z-axis direction (the first direction, the upper-lower direction) from the part connected with the base part 6211 toward an upstream end 6212a in the tape feeding direction H. In other words, as illustrated in FIG. 12, in a state where the insertion member 621 is inserted between the cover tape 102 and the carrier tape 101, the base part 6211 is substantially parallel to the cover tape 102, and the tip part 6212 is inclined toward the cover tape 102 away from the carrier tape 101.

The inclined structure of the tip part 6212 of the insertion member 621 as described above makes it possible to prevent the tip part 6212 from making contact with a storage part connecting region part 101c which is a region part located between adjacent component storage parts 101a in the carrier tape 101 when the component storage tape 100 is fed by the first feeding unit 31 with the insertion member 621 inserted between the cover tape 102 and the carrier tape 101. Thus, an excellent traveling performance of the component storage tape 100 is maintained, and the components P can be efficiently supplied toward the component extracting position 21.

Further, the tip part 6212 of the insertion member 621 is formed in a tapered shape. Accordingly, an insertability of the insertion member 621 inserted between the cover tape 102 and the carrier tape 101 is improved. Further, the insertion member 621 is supported by the support member 623. In the present embodiment, the support member 623 is disposed on the upper face of the cover member 7 (described below) which is connected to the downstream end 6211a in the tape feeding direction H of the base part 6211 of the insertion member 621 and fixed to the device body 2. With such a configuration, the support member 623 supports the insertion member 621 through the cover member 7.

The cover tape cutting member 622 cuts the cover tape 102 of the component storage tape 100 which is fed by the first feeding unit 31 with its tip being a free end and travels on the second path part 52. The cover tape cutting member 622 cuts the cover tape 102 at a predetermined position (e.g., a central position) between the ends in the width direction of the cover tape 102. The cut part 102a of the cover tape 102 cut by the cover tape cutting member 622 linearly extends along the travel path 5.

The cover tape cutting member 622 includes a blade part 6221 which cuts the cover tape 102 and a holding part 6222. The holding part 6222 includes a holding face 6222a which holds the blade part 6221 so that the blade edge is exposed.

The cover tape cutting member 622 is supported by the support member 623 through the cover member 7 in such a manner that at least a face opposite to the holding face 6222a in a region part 6222b on the upstream side in the tape feeding direction H of the holding part 6222 abuts on a face 6211b (the face on the cover tape 102 side) on the other direction side (the +Z direction side, the upper direction side) in the Z-axis direction (the first direction, the upper-lower direction) of the base part 6211 of the insertion member 621. Further, in the cover tape cutting member 622, the blade part 6221 which is held by the holding face 6222a of the holding part 6222 faces the other direction side (the +Z direction side, the upper direction side) in the Z-axis direction (the first direction, the upper-lower direction). In such a configuration, when the component storage tape 100 traveling on the second path part 52 of the travel path 5 passes through the cover tape cutting member 622, the insertion member 621 is interposed between an upstream end 6222c of the cover tape cutting member 622 and the carrier tape 101. Thus, it is possible to prevent the upstream end 6222c of the cover tape cutting member 622 from making contact with the component P stored in the component storage part 101a of the carrier tape 101. Thus, it is possible to prevent the component P from being damaged by contact with the cover tape cutting member 622.

Further, in the holding part 6222 of the cover tape cutting member 622, the holding face 6222a is desirably an inclined plane which is inclined downward from the downstream side toward the upstream side in the tape feeding direction H. Accordingly, when the component storage tape 100 travels on the second path part 52 of the travel path 5 and passes through the cover tape cutting member 622, the component storage tape 100 is guided along the holding face 6222a, which is an inclined plane, of the holding part 6222. As a result, it is possible to reduce the traveling resistance when the component storage tape 100 passes through the cover tape cutting member 622.

Figure 13A:
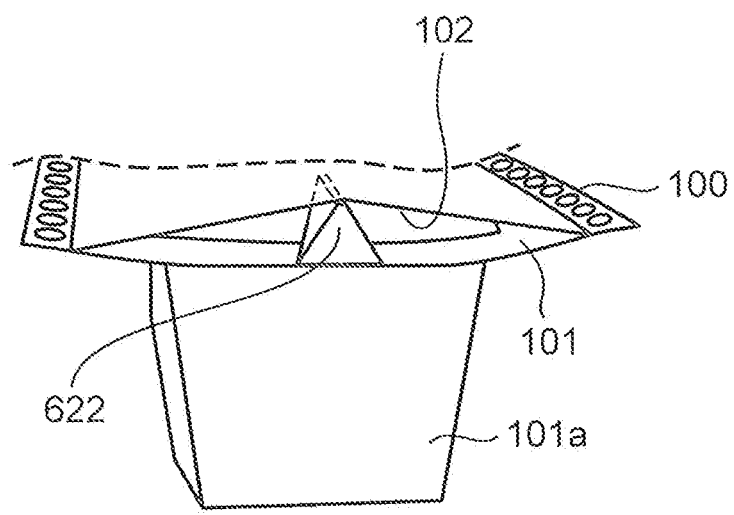
FIGS. 13A and 13B are diagrams illustrating a state in which a cover tape cutting member of the cover tape pre-process unit cuts the cover tape of the component storage tape.
Figure 13B:
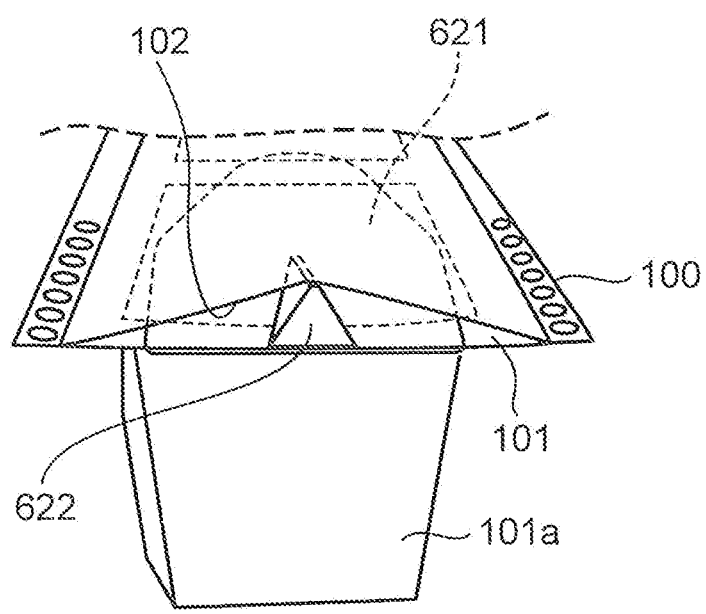

FIGS. 13A and 13B are diagrams illustrating a state in which the cover tape cutting member 622 of the cover tape pre-process unit 62 cuts the cover tape 102 of the component storage tape 100. In a state where the insertion member 621 and the cover tape cutting member 622 are inserted between the cover tape 102 and the carrier tape 101 in the component storage tape 100 traveling on the second path part 52 of the travel path 5, a tensile stress in a direction away from the carrier tape 101 is applied to the cover tape 102. The cover tape 102 is smoothly cut by the blade part 6221 of the cover tape cutting member 622 by the application of such a tensile stress to the cover tape 102.

On the other hand, when the tensile stress is applied to the cover tape 102, as illustrated in FIG. 13A, the carrier tape 101 may deform in a buckling manner. The buckling deformation of the carrier tape 101 reduces the tensile stress applied to the cover tape 102. When the tensile stress applied to the cover tape 102 is excessively reduced, smooth cutting of the cover tape 102 by the blade part 6221 of the cover tape cutting member 622 is obstructed.

Thus, as illustrated in FIG. 12, a distance K7 between the upstream end 6212a in the tape feeding direction H of the tip part 6212 in the insertion member 621 and the upstream end 6222c in the tape feeding direction H of the holding part 6222 in the cover tape cutting member 622 is set to be equal to or more than the sum of a width dimension K8 in the tape feeding direction H of each of the component storage parts 101a of the component storage tape 100 and an interval K9 between adjacent two of the component storage parts 101a. Accordingly, as illustrated in FIG. 13B, it is possible to prevent the buckling deformation of the carrier tape 101 in a state where the insertion member 621 and the cover tape cutting member 622 are inserted between the cover tape 102 and the carrier tape 101. Thus, it is possible to maintain smooth cutting of the cover tape 102 by the blade part 6221 of the cover tape cutting member 622.

Figure 14A:
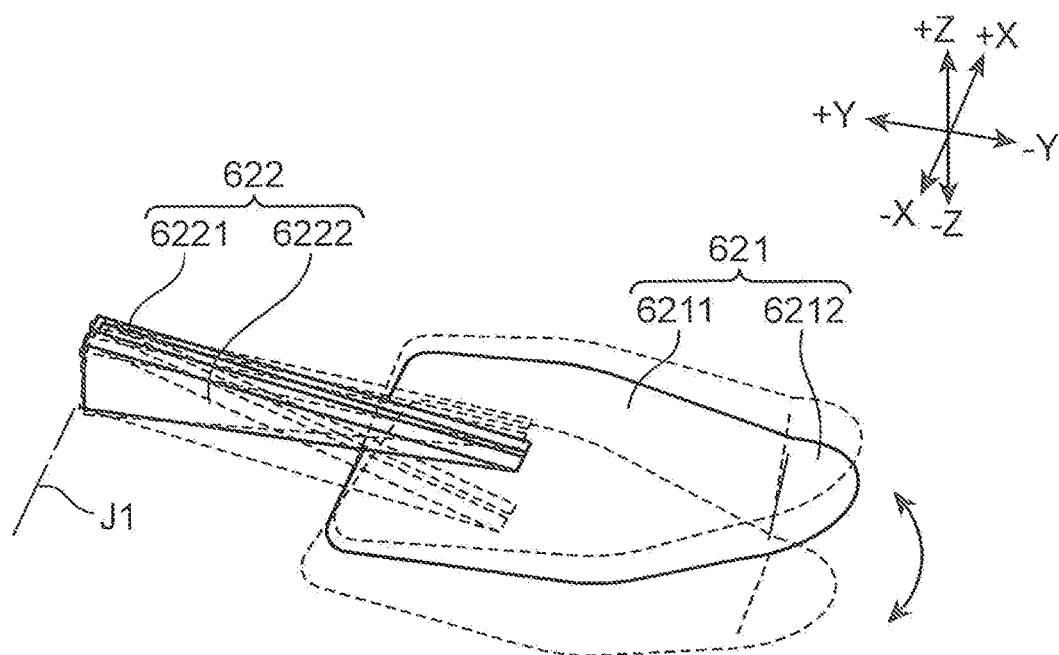
FIGS. 14A and 14B are diagrams illustrating a state of swings of the insertion member and the cover tape cutting member of the cover tape pre-process unit.
Figure 14B:
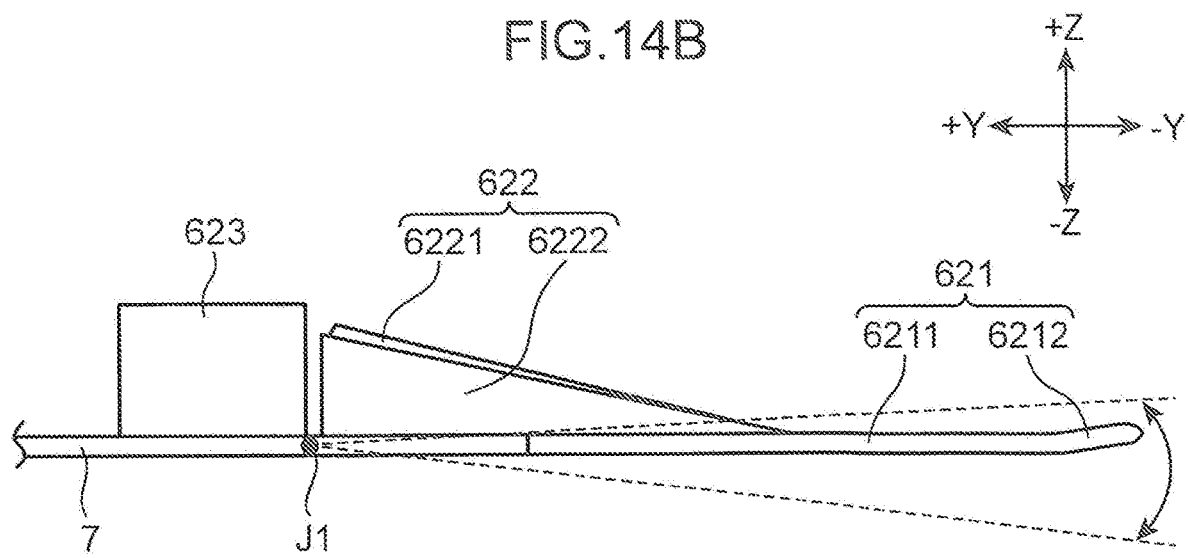

FIGS. 14A and 14B are diagrams illustrating a state of swings of the insertion member 621 and the cover tape cutting member 622 of the cover tape pre-process unit 62. The insertion member 621 may be supported by the support member 623 through the cover member 7 swingably around a predetermined axis J1 extending in the width direction of the second path part 52 of the travel path 5 (the X-axis direction). Further, at least the region part 6222b on the upstream side in the tape feeding direction H of the holding part 6222 in the cover tape cutting member 622 abuts on the face 6211b (the face on the cover tape 102 side) on the other direction side (the +Z direction side, the upper direction side) in the Z-axis direction (the first direction, the upper-lower direction) of the base part 6211 of the insertion member 621 so as to enable the cover tape cutting member 622 to swing in conjunction with the swing of the insertion member 621. Accordingly, for example, when the component storage tape 100 travels on the travel path 5 while bending, the insertion member 621 and the cover tape cutting member 622 which are inserted between the cover tape 102 and the carrier tape 101 are swingable in response to the bending of the component storage tape 100. Thus, it is possible to stably prevent the tip part 6212 of the insertion member 621 from making contact with the storage part connecting region part 101c in the carrier tape 101.

Figure 15:
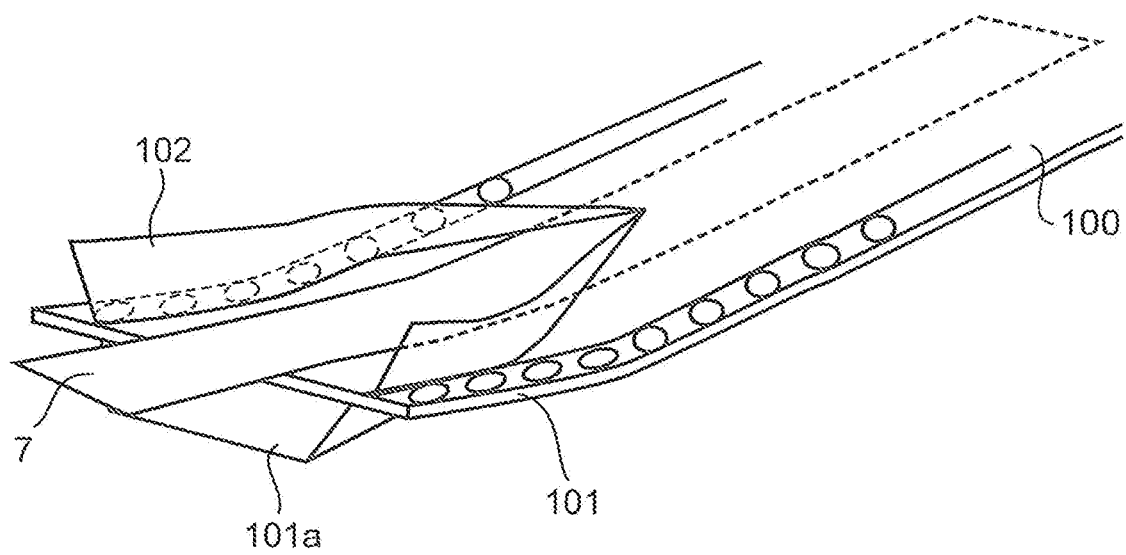
FIG. 15 is a diagram illustrating a cover member included in the component supply device.

Next, the cover member 7 included in the component supply device 1 will be described with reference to FIG. 15 in addition to FIGS. 1 and 5. FIG. 15 is a diagram illustrating the cover member 7 included in the component supply device 1. The cover member 7 covers at least a part of an opening of each of the component storage parts 101a of the component storage tape 100 after an exposing process for exposing the component P inside the component storage part 101a by the component exposing unit 6. With the configuration in which the component supply device 1 is provided with the cover member 7, it is possible to restrict jumping out of the components P from the component storage parts 101a by the cover member 7 when the component storage tape 100 after the exposing process is fed by the tape feeding unit 3. Thus, it is possible to stably supply the components to the component extracting position 21 by the component supply device 1 and efficiently supply the components toward the component extracting position 21.

In the present embodiment, the cover member 7 extends from the downstream end 6211a in the tape feeding direction H of the base part 6211 of the insertion member 621 up to the component extracting position 21 along the travel path 5. Accordingly, at least a part of the opening of each of the component storage parts 101a in the component storage tape 100 traveling on the travel path 5 is covered with the cover member 7 from the downstream end 6211a of the base part 6211 of the insertion member 621 up to the component extracting position 21. Thus, it is possible to reliably restrict jumping out of the components P from the component storage parts 101a by the cover member 7 in the component storage tape 100 after the exposing process.

Further, the cover member 7 which is connected to the downstream end 6211a of the base part 6211 of the insertion member 621 covers the component storage parts 101a along the travel path 5 in a state where the cover member 7 is inserted between the cover tape 102 and the carrier tape 101 of the component storage tape 100 fed by the tape feeding unit 3. Thus, the cover member 7 has a function of guiding traveling of the component storage tape 100 fed by the tape feeding unit 3 in a state where the cover member 7 is inserted between the cover tape 102 and the carrier tape 101. Thus, the cover member 7 forms the travel path 5 and constitutes the tape travel path forming unit 4 together with the pair of guide walls 41 and the first to sixth guide rollers 42, 43, 44, 45, 46, 47.

As described above, the first path part 51 of the travel path 5 includes the first region 511 and the second region 512 which are formed in the shape extending along the virtual curve having the inflection point F12 when viewed in the width direction of the travel path 5 (the X-axis direction). The component storage tape 100 travels while bending in the first region 511 and the second region 512 of the first path part 51. Thus, there is a possibility that, in the component storage tape 100 traveling in the first region 511 and the second region 512 of the first path part 51, a frictional force caused by contact between the cover member 7 which covers the component storage parts 101a and the carrier tape 101 increases.

Thus, the cover member 7 desirably has flexibility. In such a configuration, when the component storage tape 100 travels along the first region 511 and the second region 512 of the first path part 51 while bending, the cover member 7 bends in response to the bending of the component storage tape 100. Accordingly, in the component storage tape 100 traveling in the first region 511 and the second region 512 of the first path part 51, it is possible to prevent the increase in the frictional force caused by the contact between the cover member 7 which covers the component storage parts 101a and the carrier tape 101. Thus, it is possible to reduce the traveling resistance when the component storage tape 100 travels on the travel path 5.

Figure 16:
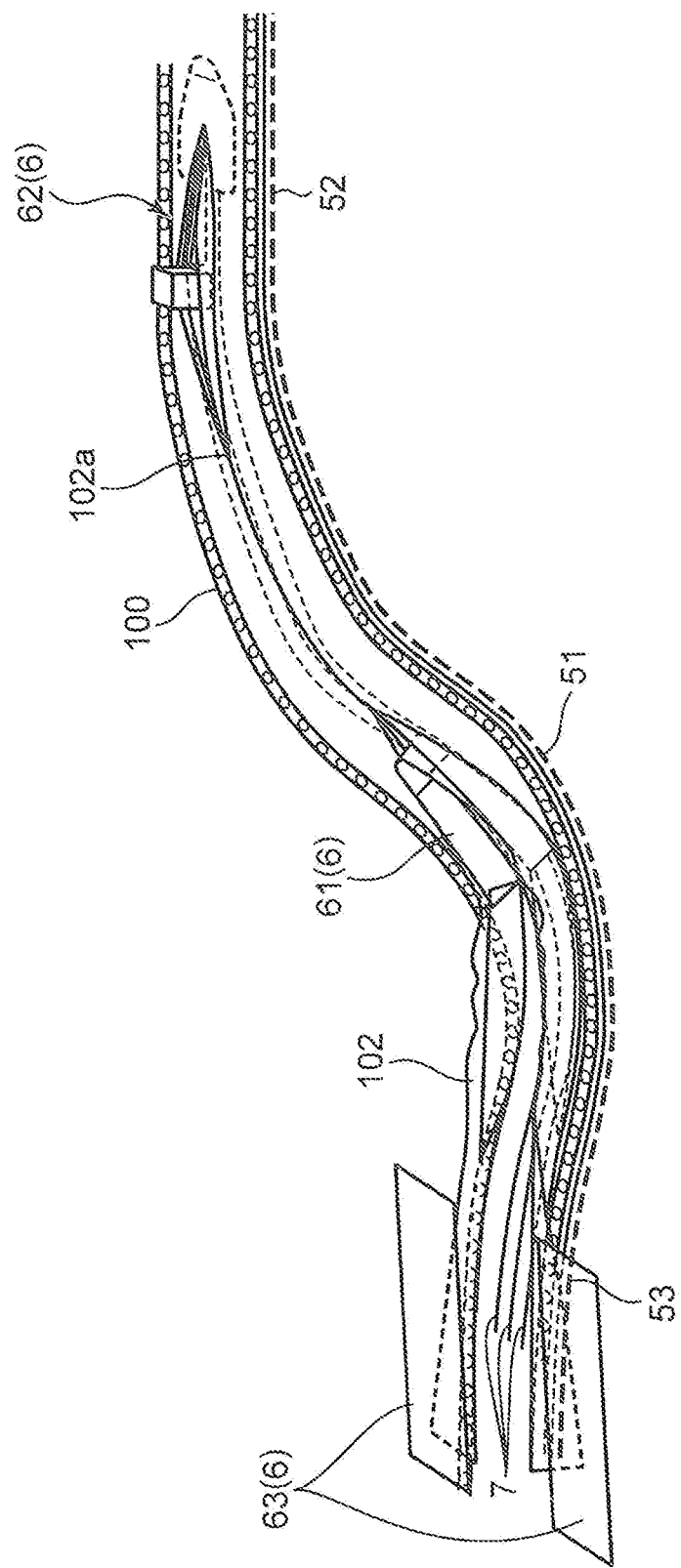
FIG. 16 is a diagram illustrating a modification of the cover member.
Figure 17:
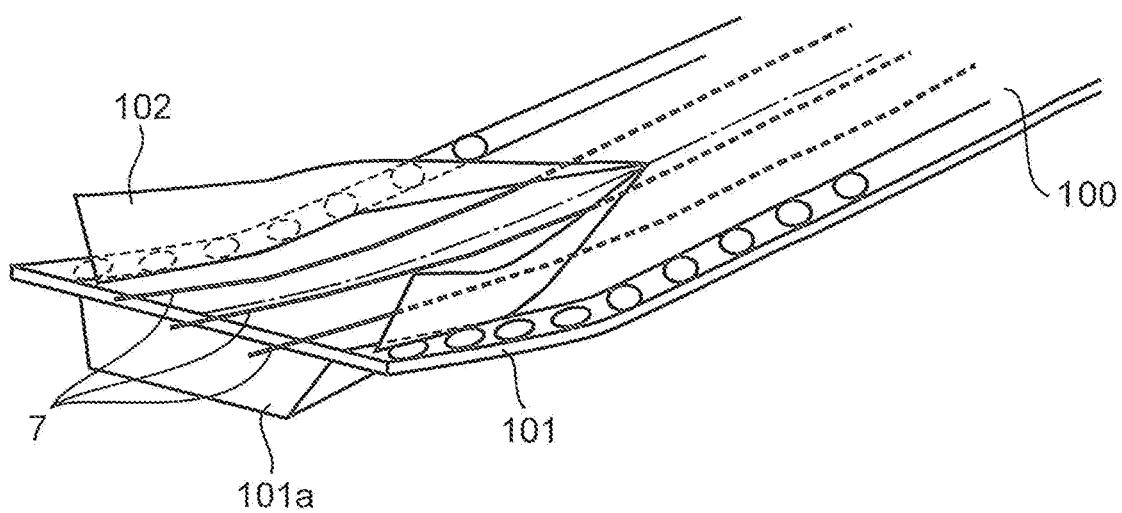
FIG. 17 is an enlarged view of the cover member of FIG. 16.

FIG. 16 is a diagram illustrating a modification of the cover member 7. FIG. 17 is an enlarged view of the cover member 7 of FIG. 16. The cover member 7 having flexibility may include a film member having a sheet-like shape as illustrated in FIG. 15. Further, the cover member 7 having flexibility may also include a plurality of linear members which are arrayed at predetermined intervals in the width direction of the travel path 5 (the X-axis direction) as illustrated in FIGS. 16 and 17.

Further, as illustrated in FIG. 11, the upstream end in the tape feeding direction H of the cover member 7, the upstream end being a part connected with the downstream end 6211a in the tape feeding direction H of the base part 6211 of the insertion member 621, is supported by the support member 623. Further, the downstream end in the tape feeding direction H of the cover member 7 is supported by the device body 2 from the upper side.

As described above, in the component storage tape 100 traveling on the first path part 51, the bending direction during traveling and the traveling behavior on the first path part 51 change at the inflection point F12 between the first virtual curve F1 extending along the first region 511 and the second virtual curve F2 extending along the second region 512 between when the component storage tape 100 is fed by the first feeding unit 31 which is disposed on the upstream side of the first path part 51 and when the component storage tape 100 is fed by the second feeding unit 32 which is disposed on the downstream side of the first path part 51.

With the configuration in which only the upstream end and the downstream end of the cover member 7 are supported by the support member 623 and the device body 2, respectively, the cover member 7 bends in response to the change in the traveling behavior of the component storage tape 100 on the first path part 51 of the travel path 5. Accordingly, it is possible to reduce the traveling resistance when the component storage tape 100 with the component storage parts 101a covered with the cover member 7 travels on the first path part 51.

Second Embodiment

FIG. 18 is a diagram schematically illustrating the configuration of a component exposing unit 60 included in a component supply device 10 according to a second embodiment of the present disclosure. The component supply device 1 according to the first embodiment described above performs the pre-process for cutting the cover tape 102 as one process in the exposing process for exposing the components P inside the component storage parts 101a of the component storage tape 100. On the other hand, the component supply device 10 according to the second embodiment performs a pre-process for releasing a cover tape 102 from a carrier tape 101 as one process in an exposing process. The component supply device 10 according to the second embodiment is configured in a manner similar to the component supply device 1 according to the first embodiment except the configuration of the component exposing unit 60. In this manner, the component supply device 10 according to the second embodiment includes parts similar to the component supply device 1 according to the first embodiment. Thus, in the following description and the drawings, corresponding similar parts will be denoted by the same reference signs, and description thereof will be omitted.

The component exposing unit 60 included in the component supply device 10 includes a cover tape raising unit 601, a cover tape pre-process unit 602, and a cover tape post-process unit 603.

FIG. 19 is a diagram illustrating the configuration of the cover tape raising unit 601 in the component exposing unit 60 according to the second embodiment. The cover tape raising unit 601 is disposed on a first path part 51 on a travel path 5. The cover tape raising unit 601 performs a raising process for raising the cover tape 102 to the +Z direction side (the upper direction side) with respect to the carrier tape 101 by coming into contact with the cover tape 102 of the component storage tape 100 traveling on the first path part 51 of the travel path 5 to expose components P.

In the present embodiment, the cover tape raising unit 601 comes into contact with the cover tape 102 separated from the carrier tape 101 by an insertion member 6021 included in the cover tape pre-process unit 602 (described below) to perform the raising process for the separated cover tape 102. The insertion member 6021 of the cover tape pre-process unit 602 separates an end on one direction side in the width direction of the cover tape 102 along a fused part 103.

The cover tape raising unit 601 is a plate-like member having a predetermined length in the tape feeding direction H. An upstream end 601A in the tape feeding direction H of the cover tape raising unit 601 is fixed to a cover member 7. The cover tape raising unit 601 extends from an end on one direction side (the +X direction side) in the width direction (the X-axis direction) to an end on the other direction side (the −X direction side) in the width direction (the X-axis direction) in the travel path 5 from the upstream side toward the downstream side in the tape feeding direction H. That is, in the cover tape raising unit 601, a most upstream end 601Aa which serves as a starting point of the contact with the cover tape 102 is located on the end on one direction side (the +X direction side) in the width direction (the X-axis direction) in the travel path 5. Further, a most downstream end 601B which serves as an end point of the contact with the cover tape 102 is located on the end on the other direction side (the −X direction side) in the width direction (the X-axis direction) in the travel path 5.

In the cover tape raising unit 601 having the above configuration, the most upstream end 601Aa comes into contact with the end on one direction side (the +X direction side) in the width direction of the cover tape 102 separated by the insertion member 6021. The most downstream end 601B of the cover tape raising unit 601 comes into contact with a boundary between the other direction side (the −X direction side) in the width direction of the cover tape 102 and the fused part 103.

Also in the component supply device 10 according to the second embodiment, in a manner similar to the component supply device 1 according to the first embodiment described above, the first path part 51 on which the cover tape raising unit 601 is disposed is inclined to one direction side (the −Z direction side, the lower direction side) in the Z-axis direction (the first direction, the upper-lower direction) from the upstream side toward the downstream side in the tape feeding direction H. Accordingly, it is possible to increase a travel distance of the component storage tape 100 when the component storage tape 100 travels on the first path part 51 and passes through the cover tape raising unit 601.

Further, in the cover tape 102 raised by the cover tape raising unit 601, the generation of a tensile stress directing from the downstream end 102b in the tape feeding direction H toward the raising starting point is prevented. Thus, it is possible to prevent buckling deformation of the carrier tape 101, the buckling deformation being caused by the tensile stress of the cover tape 102, during the raising process for the cover tape 102 by the cover tape raising unit 601. Thus, an excellent traveling performance of the component storage tape 100 is maintained, and the components P can be efficiently supplied toward the component extracting position 21.

The cover tape pre-process unit 602 is disposed on a second path part 52, which is continuous with the upstream side in the tape feeding direction H of the first path part 51 in the travel path 5, away from the cover tape raising unit 601. The cover tape pre-process unit 602 performs a pre-process for releasing the cover tape 102 from the carrier tape 101 on one end in the width direction of the component storage tape 100 which is fed by a first feeding unit 31 and travels on the second path part 52 with its tip being a free end prior to the raising process for the cover tape 102 by the cover tape raising unit 601. Accordingly, the cover tape raising unit 601 smoothly comes into contact with the cover tape 102 of the component storage tape 100, and the raising process for the cover tape 102 by the cover tape raising unit 601 is smoothly performed.

Further, the component storage tape 100 is fed by the first feeding unit 31 with its tip being a free end and travels on the second path part 52 and the first path part 51 from the upstream side toward the downstream side of the travel path 5. Here, the cover tape pre-process unit 602 is disposed on the second path part 52 away from the cover tape raising unit 601 which is disposed on the first path part 51. Thus, when the component storage tape 100 travels on the second path part 52 on the upstream side of the first path part 51 in the travel path 5 and passes through the cover tape pre-process unit 602, the raising process has not yet been performed on the cover tape 102 of the component storage tape 100. As a result, in the component storage tape 100 traveling on the second path part 52 on which the cover tape pre-process unit 602 is disposed, it is possible to prevent the buckling deformation of the carrier tape 101, the buckling deformation being caused by the tensile stress of the cover tape 102 associated with the raising process.

The component storage tape 100 after the raising process for the cover tape 102 by the cover tape raising unit 601 is fed to a third path part 53 on the downstream side of the first path part 51 in the travel path 5 by the second feeding unit 32. The cover tape post-process unit 603 is disposed on the third path part 53. The cover tape post-process unit 603 performs a post-process for spreading out the cover tape 102 raised by the cover tape raising unit 601 in the width direction of the component storage tape 100. Accordingly, an exposed degree of the component P inside the component storage part 101a of the component storage tape 100 increases. Thus, it is possible to improve a removal performance for the component P at the component extracting position 21.

Figure 20A:
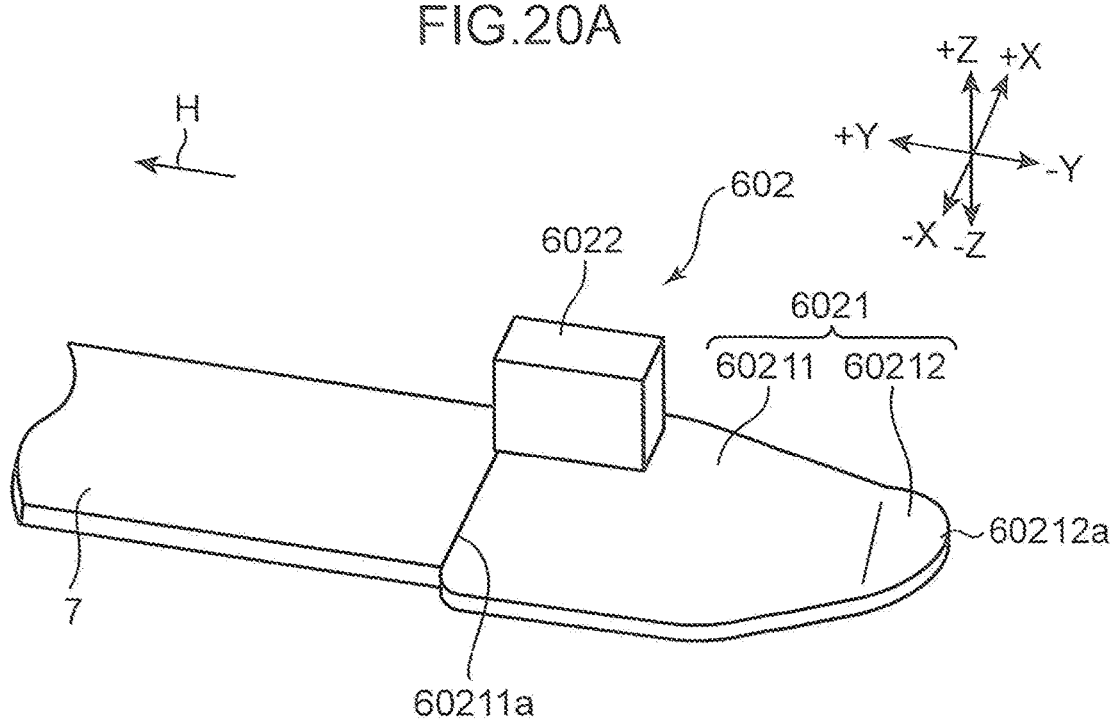
FIGS. 20A and 20B are diagrams illustrating the configuration of a cover tape pre-process unit in the component exposing unit according to the second embodiment.
Figure 20B:
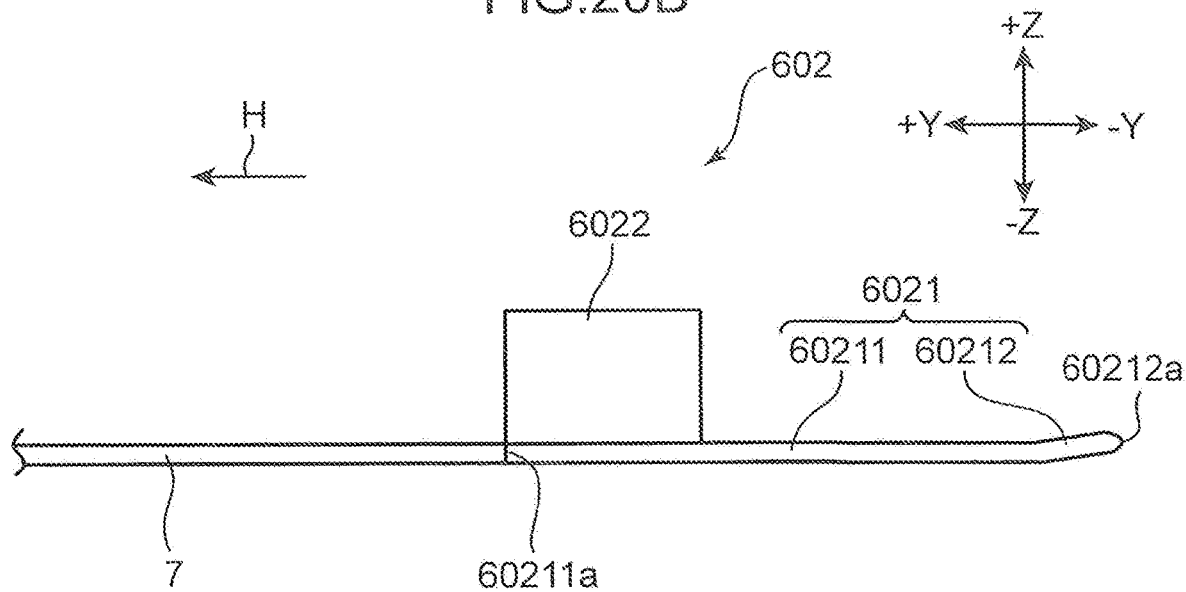

The detailed configuration of the cover tape pre-process unit 602 of the component exposing unit 60 will be described with reference to FIGS. 20A and 20B. FIGS. 20A and 20B are diagrams illustrating the cover tape pre-process unit 602 of the component exposing unit 60 according to the second embodiment. The cover tape pre-process unit 602 includes an insertion member 6021 and a support member 6022.

The insertion member 6021 is inserted between the cover tape 102 and the carrier tape 101 on an end on one direction side (the +X direction side) in the width direction of the component storage tape 100 which is fed by the first feeding unit 31 with its tip being a free end and travels on the second path part 52. The insertion member 6021 separates the end on one direction side (the +X direction side) in the width direction of the cover tape 102 along the fused part 103.

The insertion member 6021 is formed in a flat-plate shape. The insertion member 6021 includes a base part 60211 and a tip part 60212 which is continuous with the upstream end in the tape feeding direction H of the base part 60211. The cover member 7 is connected to a downstream end 60211a in the tape feeding direction H of the base part 60211 of the insertion member 6021.

Figure 21A:
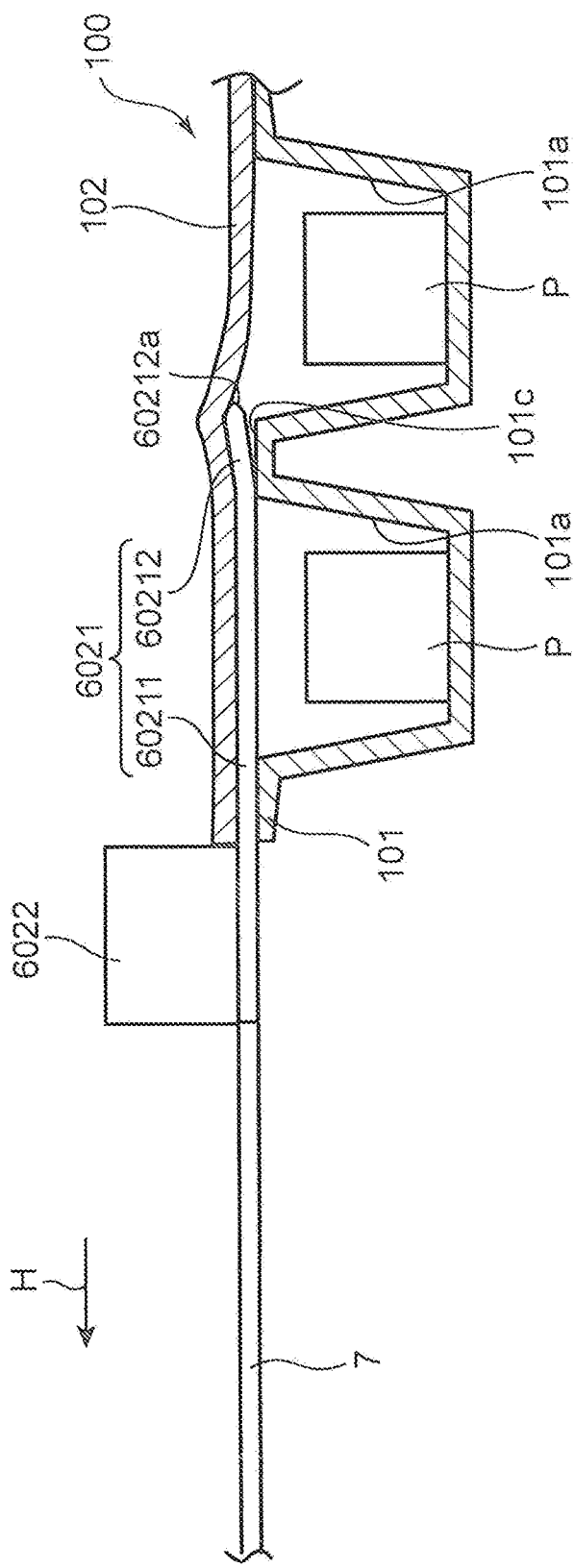
FIGS. 21A and 21B are diagrams illustrating a state in which an insertion member of the cover tape pre-process unit is inserted between a cover tape and a carrier tape of a component storage tape.
Figure 21B:
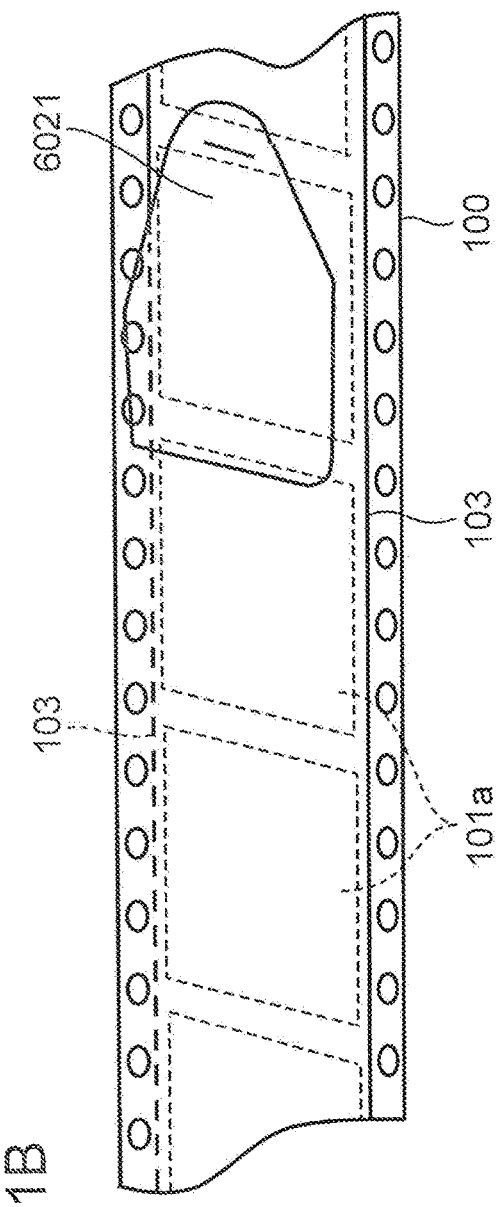

FIGS. 21A and 21B are diagrams illustrating a state in which the insertion member 6021 of the cover tape pre-process unit 602 is inserted between the cover tape 102 and the carrier tape 101 of the component storage tape 100. In the insertion member 6021, the tip part 60212 is inclined upward with respect to the base part 60211 in such a manner that the tip part 60212 is inclined to the other direction side (the +Z direction side, the upper direction side) in the Z-axis direction (the first direction, the upper-lower direction) from the part connected with the base part 60211 toward an upstream end 60212a in the tape feeding direction H. In other words, as illustrated in FIGS. 21A and 21B, in a state where the insertion member 6021 is inserted between the cover tape 102 and the carrier tape 101, the base part 60211 is substantially parallel to the cover tape 102, and the tip part 60212 is inclined toward the cover tape 102 away from the carrier tape 101.

The inclined structure of the tip part 60212 of the insertion member 6021 as described above makes it possible to prevent the tip part 60212 from making contact with a storage part connecting region part 101c in the carrier tape 101 when the component storage tape 100 is fed by the first feeding unit 31 with the insertion member 6021 inserted between the cover tape 102 and the carrier tape 101. Thus, an excellent traveling performance of the component storage tape 100 is maintained, and the components P can be efficiently supplied toward the component extracting position 21. Further, the insertion member 6021 is supported by the support member 6022. The support member 6022 is fixed to a device body 2.

Figure 22A:
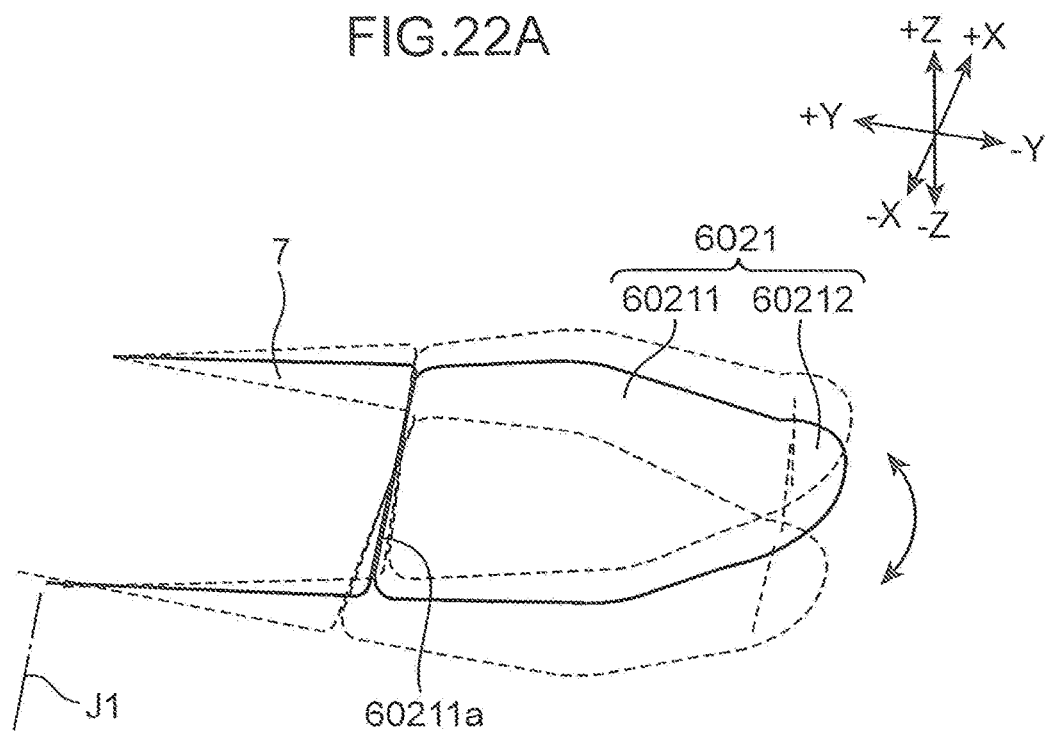
FIGS. 22A and 22B are diagrams illustrating a state of a swing of the insertion member of the cover tape pre-process unit.
Figure 22B:
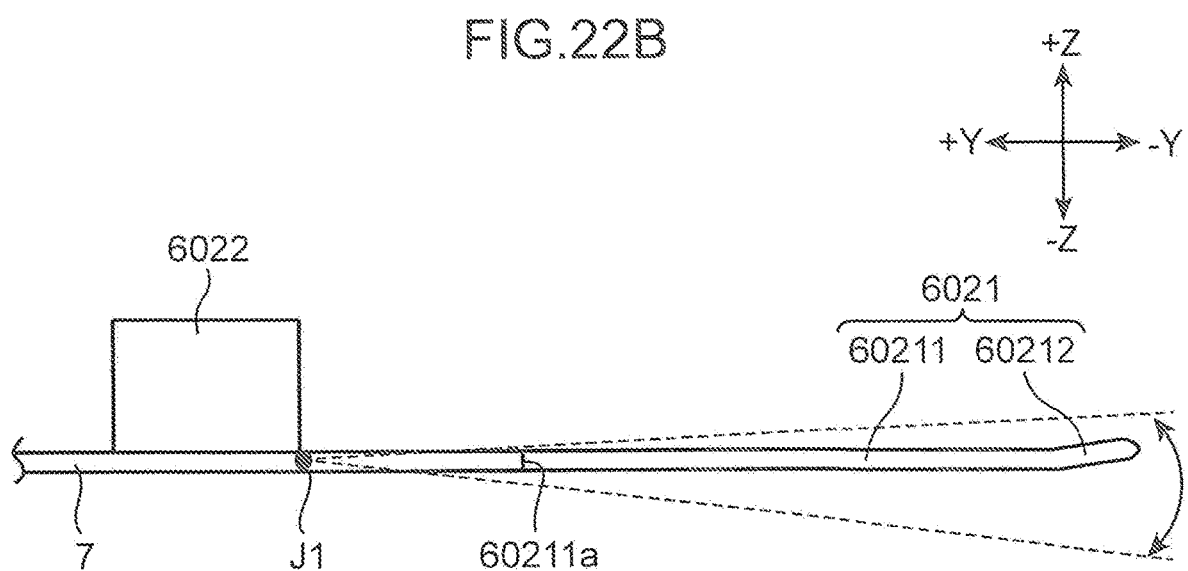

FIGS. 22A and 22B are diagrams illustrating a state of a swing of the insertion member 6021 of the cover tape pre-process unit 602. The support member 6022 may be disposed on the upper face of the cover member 7 which is connected to the downstream end 60211a in the tape feeding direction H of the base part 60211 of the insertion member 6021. In this case, the support member 6022 supports the insertion member 6021 through the cover member 7.

The insertion member 6021 may be supported by the support member 6022 through the cover member 7 swingably around a predetermined axis J1 extending in the width direction of the second path part 52 of the travel path 5 (the X-axis direction). Accordingly, for example, when the component storage tape 100 travels on the travel path 5 while bending, the insertion member 6021 which is inserted between the cover tape 102 and the carrier tape 101 is swingable in response to the bending of the component storage tape 100. Thus, it is possible to stably prevent contact of the tip part 60212 of the insertion member 6021 with the storage part connecting region part 101c in the carrier tape 101.

Figure 23A:
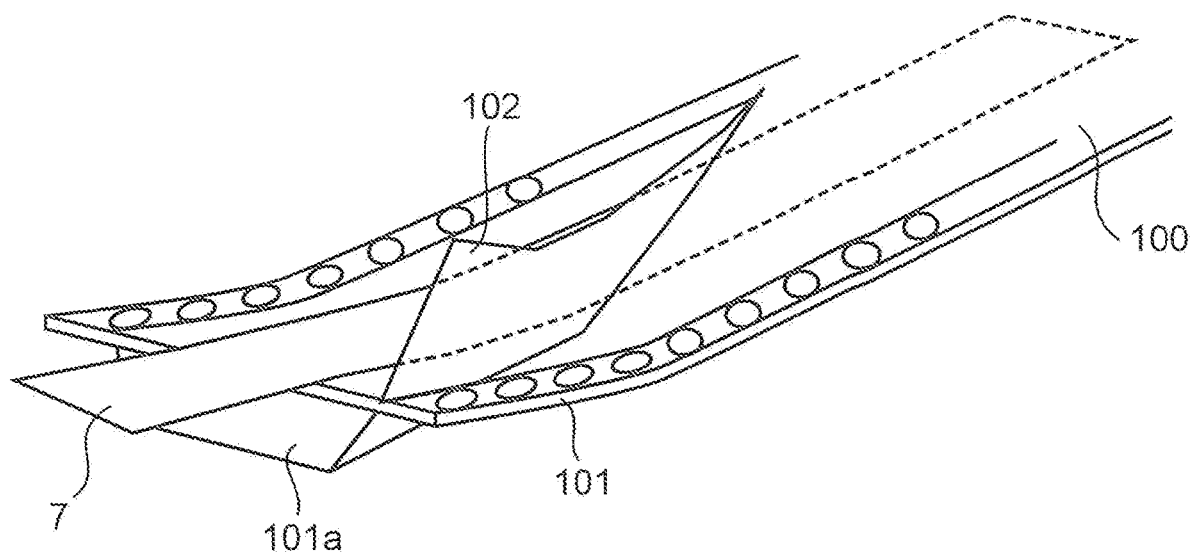
FIGS. 23A and 23B are diagrams illustrating a cover member included in the component supply device according to the second embodiment.
Figure 23B:
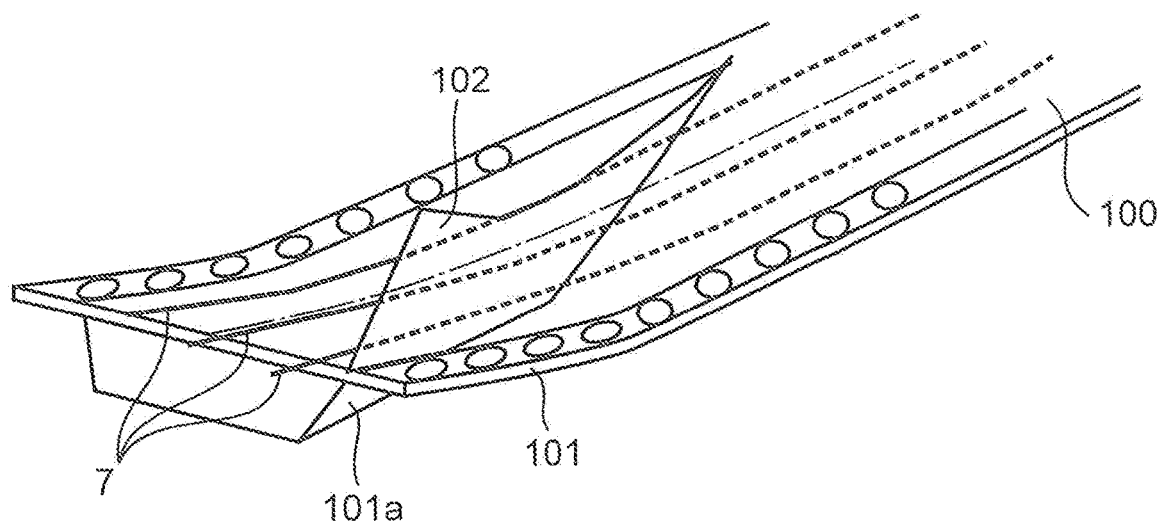

FIGS. 23A and 23B are diagrams illustrating the cover member 7 included in the component supply device 10 according to the second embodiment. The cover member 7 included in the component supply device 10 according to the second embodiment may be configured in a manner similar to the cover member 7 of the component supply device 1 according to the first embodiment described above. That is, the cover member 7 included in the component supply device 10 desirably has flexibility. Further, the cover member 7 may include a film member having a sheet-like shape as illustrated in FIG. 23A. Further, the cover member 7 may also include a plurality of linear members which are arrayed at predetermined intervals in the width direction of the travel path 5 (the X-axis direction) as illustrated in FIG. 23B.

The component supply device according to the embodiments of the present disclosure has been described above. However, the present disclosure is not limited thereto, and, for example, modifications as described below can be employed.

In the above embodiment, one direction in which the first path part 51 on which the cover tape raising unit 61 is disposed on the travel path 5 is inclined in the Z-axis direction (the first direction, the upper-lower direction) from the upstream side toward the downstream side in the tape feeding direction H is the lower direction (−Z direction). However, the present disclosure is not limited to this configuration. The one direction in which the first path part 51 on which the cover tape raising unit 61 is disposed is inclined in the Z-axis direction (the first direction, the upper-lower direction) from the upstream side toward the downstream side in the tape feeding direction H may be the upper direction (the +Z direction).

Further, in the above embodiment, the cover tape pre-process unit 62 includes the insertion member 621 and the cover tape cutting member 622 as separate members. However, the present disclosure is not limited to this configuration. The holding part 6222 of the cover tape cutting member 622 may have a function of the insertion member 621. In this case, a structure in which the holding part 6222 and the insertion member 621 are integrally formed serves as an insertion member.

Note that the specific embodiments described above mainly include the disclosure having the following configuration.

A component supply device according to one aspect of the present disclosure supplies components to a component extracting position using a component storage tape, the component storage tape including a carrier tape including a plurality of component storage parts arrayed at predetermined intervals for storing the components and a cover tape stuck to the carrier tape to cover the component storage parts. The component supply device includes a tape feeding unit that feeds the component storage tape toward the component extracting position in a tape feeding direction along an array direction of the component storage parts, a tape travel path forming unit that forms a travel path leading to the component extracting position for the component storage tape fed by the tape feeding unit, and a component exposing unit that is disposed on the travel path and exposes the components inside the component storage parts of the component storage tape traveling on the travel path. The component exposing unit includes an insertion member inserted between the cover tape and the carrier tape in the component storage tape traveling on the travel path, the insertion member including a base part and a tip part continuous with an upstream end in the tape feeding direction of the base part. The tip part is inclined toward the cover tape away from the carrier tape with respect to the base part in a state where the insertion member is inserted between the cover tape and the carrier tape.

According to the component supply device, the component exposing unit that exposes the components inside the component storage parts of the component storage tape traveling on the travel path formed from the tape travel path forming unit includes the insertion member. The insertion member is inserted between the cover tape and the carrier tape in the component storage tape and includes the base part and the tip part. Further, the tip part is inclined toward the cover tape away from the carrier tape in a state where the insertion member is inserted between the cover tape and the carrier tape. Accordingly, when the component storage tape is fed by the tape feeding unit with the insertion member inserted between the cover tape and the carrier tape, it is possible to prevent the tip part of the insertion member from making contact with a storage part connecting region part between adjacent component storage parts, in the carrier tape. Thus, an excellent traveling performance of the component storage tape is maintained, and the components can be efficiently supplied to the component extracting position.

The above component supply device may further include a cover member having flexibility, the cover member being connected to a downstream end in the tape feeding direction of the base part of the insertion member. The component exposing unit further includes a support member fixed to a device body, the support member supporting the insertion member through the cover member swingably around a predetermined axis extending in a width direction of the travel path.

In this aspect, the insertion member is swingably supported by the support member. Thus, for example, when the component storage tape travels on the travel path while bending, the insertion member inserted between the cover tape and the carrier tape is swingable in response to the bending of the component storage tape. Thus, it is possible to stably prevent contact of the tip part of the insertion member with the storage part connecting region part in the carrier tape.

In the above component supply device, the component exposing unit may further include a cover tape cutting member, the cover tape cutting member including a blade part that cuts the cover tape of the component storage tape traveling on the travel path and a holding part including a holding face that holds the blade part so that a blade edge is exposed. At least a region part on an upstream side in the tape feeding direction of the holding part in the cover tape cutting member abuts on a face on a side of the cover tape of the base part in the insertion member so as to enable the cover tape cutting member to swing in conjunction with a swing of the insertion member.

In this aspect, the component exposing unit includes the cover tape cutting member that cuts the cover tape of the component storage tape traveling on the travel path. The region part on the upstream side of the holding part that holds the blade part in the cover tape cutting member abuts on the base part in the insertion member so as to enable the cover tape cutting member to swing in conjunction with a swing of the insertion member. In such a configuration, when the component storage tape traveling on the travel path passes through the cover tape cutting member, the insertion member is interposed between the upstream end of the cover tape cutting member and the carrier tape. Thus, it is possible to prevent the upstream end of the cover tape cutting member from making contact with the component stored in the component storage part of the carrier tape. Thus, it is possible to prevent the component from being damaged by contact with the cover tape cutting member.

In the above component supply device, the holding face in the holding part of the cover tape cutting member is an inclined plane inclined downward from the downstream side toward the upstream side in the tape feeding direction.

In this aspect, when the component storage tape travels on the travel path and passes through the cover tape cutting member, the component storage tape is guided along the holding face, which is an inclined plane, of the holding part. Accordingly, it is possible to reduce the traveling resistance when the component storage tape passes through the cover tape cutting member.

In the above component supply device, a distance between an upstream end in the tape feeding direction of the tip part in the insertion member and an upstream end in the tape feeding direction of the holding part in the cover tape cutting member is set to be equal to or more than a sum of a width dimension in the tape feeding direction of each of the component storage parts in the component storage tape and an interval between adjacent two of the component storage parts.

In a state where the insertion member and the cover tape cutting member are inserted between the cover tape and the carrier tape in the component storage tape traveling on the travel path, a tensile stress in a direction away from the carrier tape is applied to the cover tape. The cover tape is smoothly cut by the blade part of the cover tape cutting member by the application of such a tensile stress to the cover tape.

On the other hand, when the tensile stress is applied to the cover tape, the carrier tape may deform in a buckling manner. The buckling deformation of the carrier tape reduces the tensile stress applied to the cover tape. When the tensile stress applied to the cover tape is excessively reduced, smooth cutting of the cover tape by the blade part of the cover tape cutting member is obstructed.

Thus, setting the distance between the upstream end of the tip part of the insertion member and the upstream end of the holding part in the cover tape cutting member as described above makes it possible to prevent the buckling deformation of the carrier tape in a state where the insertion member and the cover tape cutting member are inserted between the cover tape and the carrier tape. Accordingly, it is possible to maintain smooth cutting of the cover tape by the blade part of the cover tape cutting member.

As described above, according to the present disclosure, it is possible to provide the component supply device that supplies components stored in the component storage tape to the component extracting position, the component supply device being capable of efficiently supplying the components.

What is claimed is:

1. A component supply device that supplies components to a component extracting position using a component storage tape, the component supply device comprising:
   a tape feeding unit configured to feed the component storage tape toward the component extracting position in a tape feeding direction along an array direction of a plurality of component storage parts, arrayed at predetermined intervals on a carrier tape of the component storage tape, for storing the components;
   a tape travel path forming unit configured to form a travel path leading to the component extracting position for the component storage tape fed by the tape feeding unit; and
   a component exposing unit that is disposed on the travel path and configured to expose the components inside the component storage parts of the component storage tape traveling on the travel path,
   wherein the component exposing unit includes an insertion member inserted between the carrier tape in the component storage tape traveling on the travel path and a cover tape stuck to the carrier tape to cover the component storage parts, the insertion member including a base part and a tip part continuous with an upstream end in the tape feeding direction of the base part, the insertion member having a flat-plate shape and being swingable around a predetermined axis extending in a width direction of the travel path,
   the base part is parallel to the cover tape, and
   the tip part is inclined to an upper side from a part connected with the base part toward an upstream end in the tape feeding direction and inclined upward toward the cover tape away from the carrier tape with respect to the base part when the insertion member is inserted between the cover tape and the carrier tape.

2. The component supply device according to claim 1, further comprising a cover member having flexibility, the cover member being connected to a downstream end in the tape feeding direction of the base part of the insertion member,
   wherein the component exposing unit further includes a support member fixed to a device body of the component supply device, the support member supporting the insertion member through the cover member swingably around a predetermined axis extending in a width direction of the travel path.

3. The component supply device according to claim 2, wherein
   the component exposing unit further includes a cover tape cutting member, the cover tape cutting member including a blade part that cuts the cover tape of the component storage tape traveling on the travel path and a holding part including a holding face that holds the blade part so that a blade edge is exposed, and
   at least a region part on an upstream side in the tape feeding direction of the holding part in the cover tape cutting member abuts on a face on a side of the cover tape of the base part in the insertion member so as to enable the cover tape cutting member to swing in conjunction with a swing of the insertion member.

4. The component supply device according to claim 3, wherein the holding face in the holding part of the cover tape cutting member is an inclined plane inclined downward from a downstream side toward the upstream side in the tape feeding direction.

5. The component supply device according to claim 4, wherein a distance between an upstream end in the tape feeding direction of the tip part in the insertion member and an upstream end in the tape feeding direction of the holding part in the cover tape cutting member is set to be equal to or more than a sum of a width dimension in the tape feeding direction of each of the component storage parts in the component storage tape and an interval between adjacent two of the component storage parts.

* * * * *